United States Patent
Sun et al.

(10) Patent No.: US 9,691,437 B2
(45) Date of Patent: Jun. 27, 2017

(54) COMPACT MICROELECTRONIC ASSEMBLY HAVING REDUCED SPACING BETWEEN CONTROLLER AND MEMORY PACKAGES

(71) Applicant: Invensas Corporation, San Jose, CA (US)

(72) Inventors: Zhuowen Sun, Campbell, CA (US); Yong Chen, Palo Alto, CA (US)

(73) Assignee: Invensas Corporation, San Jose, CA (US)

( * ) Notice: Subject to any disclaimer, the term of this patent is extended or adjusted under 35 U.S.C. 154(b) by 142 days.

(21) Appl. No.: 14/496,159

(22) Filed: Sep. 25, 2014

(65) Prior Publication Data
US 2016/0093340 A1 Mar. 31, 2016

(51) Int. Cl.
*G11C 5/06* (2006.01)
*G11C 5/02* (2006.01)
*H01L 23/00* (2006.01)

(52) U.S. Cl.
CPC .............. *G11C 5/063* (2013.01); *G11C 5/025* (2013.01); *H01L 24/00* (2013.01)

(58) Field of Classification Search
CPC ... H01L 45/04; H01L 45/144; H01L 45/1233; H01L 45/06; H01L 24/00
USPC .............. 257/1–8, 68–74, 678, 675; 356/51
See application file for complete search history.

(56) References Cited

U.S. PATENT DOCUMENTS

| | | |
|---|---|---|
| 3,670,208 A | 6/1972 | Hovnanian et al. |
| 4,599,634 A * | 7/1986 | Culmer .................. H01L 27/20 257/254 |
| 4,747,081 A | 5/1988 | Heilveil et al. |
| 5,148,265 A | 9/1992 | Khandros et al. |
| 5,148,266 A | 9/1992 | Khandros et al. |
| 5,163,024 A | 11/1992 | Heilveil et al. |
| 5,210,639 A | 5/1993 | Redwine et al. |
| 5,480,840 A | 1/1996 | Barnes et al. |

(Continued)

FOREIGN PATENT DOCUMENTS

| | | |
|---|---|---|
| CN | 1477688 A | 2/2004 |
| CN | 101149964 A | 3/2008 |

(Continued)

OTHER PUBLICATIONS

Taiwanese Office Action for Application No. 101136578 dated May 12, 2015.

(Continued)

*Primary Examiner* — Monica D Harrison
(74) *Attorney, Agent, or Firm* — Lerner, David, Littenberg, Krumholz & Mentlik, LLP

(57) ABSTRACT

A microelectronic package has terminals at a surface of a substrate having first and second half areas, each half area extending from a diagonal that bisects the first surface and a respective opposite corner of the first surface. Terminals for carrying data and address information in the first half area provide first memory channel access to a first memory storage array, and terminals for carrying data and address information in the second half area provide second memory channel access to a second memory storage array. The package may include first and second microelectronic elements overlying a same surface of the substrate which may be stacked in transverse orientations.

21 Claims, 15 Drawing Sheets

(56) References Cited

U.S. PATENT DOCUMENTS

| | | |
|---|---|---|
| 5,679,977 A | 10/1997 | Khandros et al. |
| 5,691,570 A | 11/1997 | Kozuka |
| 5,751,553 A | 5/1998 | Clayton |
| 5,777,391 A | 7/1998 | Nakamura et al. |
| 5,821,614 A | 10/1998 | Hashimoto et al. |
| 5,899,705 A | 5/1999 | Akram |
| 5,929,517 A | 7/1999 | Distefano et al. |
| 5,936,305 A | 8/1999 | Akram |
| 5,949,700 A | 9/1999 | Furukawa et al. |
| 5,973,403 A | 10/1999 | Wark |
| 6,086,386 A | 7/2000 | Fjelstad et al. |
| 6,130,116 A | 10/2000 | Smith et al. |
| 6,159,837 A | 12/2000 | Yamaji et al. |
| 6,177,636 B1 | 1/2001 | Fjelstad |
| 6,197,665 B1 | 3/2001 | DiStefano et al. |
| 6,252,264 B1 | 6/2001 | Bailey et al. |
| 6,255,899 B1 | 7/2001 | Bertin et al. |
| 6,261,867 B1 | 7/2001 | Robichaud et al. |
| 6,297,960 B1 | 10/2001 | Moden et al. |
| 6,313,532 B1 | 11/2001 | Shimoishizaka et al. |
| 6,323,436 B1 | 11/2001 | Hedrick et al. |
| 6,343,019 B1 | 1/2002 | Jiang et al. |
| 6,376,769 B1 | 4/2002 | Chung |
| 6,380,318 B1 | 4/2002 | Saito et al. |
| 6,384,473 B1 | 5/2002 | Peterson et al. |
| 6,426,560 B1 | 7/2002 | Kawamura et al. |
| 6,433,422 B1 | 8/2002 | Yamasaki |
| 6,445,594 B1 | 9/2002 | Nakagawa et al. |
| 6,452,266 B1 | 9/2002 | Iwaya et al. |
| 6,461,895 B1 | 10/2002 | Liang et al. |
| 6,462,423 B1 | 10/2002 | Akram et al. |
| 6,518,794 B2 | 2/2003 | Coteus et al. |
| 6,521,981 B2 | 2/2003 | Miyazaki et al. |
| 6,560,134 B2 | 5/2003 | Brox et al. |
| 6,577,004 B1 | 6/2003 | Rumsey et al. |
| 6,611,057 B2 | 8/2003 | Mikubo et al. |
| 6,617,695 B1 | 9/2003 | Kasatani |
| 6,619,973 B2 | 9/2003 | Perino et al. |
| 6,620,648 B2 | 9/2003 | Yang |
| 6,628,528 B2 | 9/2003 | Schoenborn |
| 6,633,078 B2 | 10/2003 | Hamaguchi et al. |
| 6,658,530 B1 | 12/2003 | Robertson et al. |
| 6,661,089 B2 | 12/2003 | Huang |
| 6,692,987 B2 | 2/2004 | Lim et al. |
| 6,707,141 B2 | 3/2004 | Akram |
| 6,720,666 B2 | 4/2004 | Lim et al. |
| 6,742,098 B1 | 5/2004 | Halbert et al. |
| 6,744,137 B2 | 6/2004 | Kinsman |
| 6,765,288 B2 | 7/2004 | Damberg |
| 6,781,220 B2 | 8/2004 | Taube et al. |
| 6,821,815 B2 | 11/2004 | Smith et al. |
| 6,836,007 B2 | 12/2004 | Michii et al. |
| 6,876,088 B2 | 4/2005 | Harvey |
| 6,894,379 B2 | 5/2005 | Feurle |
| 6,894,381 B2 | 5/2005 | Hetzel et al. |
| 6,906,415 B2 | 6/2005 | Jiang et al. |
| 6,943,057 B1 | 9/2005 | Shim et al. |
| 6,977,440 B2 | 12/2005 | Pflughaupt et al. |
| 6,982,485 B1 | 1/2006 | Lee et al. |
| 7,061,092 B2 | 6/2006 | Akram et al. |
| 7,061,105 B2 | 6/2006 | Masuda et al. |
| 7,061,121 B2 | 6/2006 | Haba |
| 7,074,696 B1 | 7/2006 | Frankowsky et al. |
| 7,091,064 B2 | 8/2006 | Jiang |
| 7,122,897 B2 | 10/2006 | Aiba et al. |
| 7,123,497 B2 | 10/2006 | Matsui et al. |
| 7,138,709 B2 | 11/2006 | Kumamoto |
| 7,141,879 B2 | 11/2006 | Wakamiya et al. |
| 7,145,226 B2 | 12/2006 | Kumamoto |
| 7,151,319 B2 | 12/2006 | Iida et al. |
| 7,164,149 B2 | 1/2007 | Matsubara |
| 7,170,158 B2 | 1/2007 | Choi et al. |
| 7,262,507 B2 | 8/2007 | Hino et al. |
| 7,272,888 B2 | 9/2007 | DiStefano |
| 7,294,928 B2 | 11/2007 | Bang et al. |
| 7,324,352 B2 | 1/2008 | Goodwin |
| 7,368,319 B2 | 5/2008 | Ha et al. |
| 7,372,169 B2 | 5/2008 | Chang |
| 7,389,937 B2 | 6/2008 | Ito |
| 7,405,471 B2 | 7/2008 | Kledzik et al. |
| 7,414,312 B2 | 8/2008 | Nguyen et al. |
| 7,420,284 B2 | 9/2008 | Miyazaki et al. |
| 7,476,975 B2 | 1/2009 | Ogata |
| 7,518,226 B2 | 4/2009 | Cablao et al. |
| 7,535,110 B2 | 5/2009 | Wu et al. |
| 7,550,842 B2 | 6/2009 | Khandros et al. |
| 7,589,409 B2 | 9/2009 | Gibson et al. |
| 7,633,146 B2 | 12/2009 | Masuda et al. |
| 7,633,147 B2 | 12/2009 | Funaba et al. |
| 7,642,635 B2 | 1/2010 | Kikuchi et al. |
| 7,692,278 B2 | 4/2010 | Periaman et al. |
| 7,692,931 B2 | 4/2010 | Chong et al. |
| 7,763,964 B2 | 7/2010 | Matsushima |
| 7,763,969 B2 | 7/2010 | Zeng et al. |
| RE41,478 E | 8/2010 | Nakamura et al. |
| RE41,721 E | 9/2010 | Nakamura et al. |
| RE41,722 E | 9/2010 | Nakamura et al. |
| 7,795,721 B2 | 9/2010 | Kurita |
| RE41,972 E | 11/2010 | Lenander et al. |
| 7,855,445 B2 | 12/2010 | Landry et al. |
| 7,989,940 B2 | 8/2011 | Haba et al. |
| RE42,972 E | 11/2011 | Nakamura et al. |
| 8,072,037 B2 | 12/2011 | Murphy et al. |
| 8,138,015 B2 | 3/2012 | Joseph et al. |
| 8,254,155 B1 | 8/2012 | Crisp et al. |
| 8,278,764 B1 | 10/2012 | Crisp et al. |
| 8,338,963 B2 | 12/2012 | Haba et al. |
| 8,345,441 B1 | 1/2013 | Crisp et al. |
| 8,378,478 B2 | 2/2013 | Desai et al. |
| 8,405,207 B1 | 3/2013 | Crisp et al. |
| 8,426,983 B2 | 4/2013 | Takeda et al. |
| 8,432,046 B2 | 4/2013 | Miyata et al. |
| 8,436,457 B2 | 5/2013 | Crisp et al. |
| 8,436,477 B2 | 5/2013 | Crisp et al. |
| 8,441,111 B2 | 5/2013 | Crisp et al. |
| 8,502,390 B2 | 8/2013 | Crisp et al. |
| 8,513,813 B2 | 8/2013 | Crisp et al. |
| 8,513,817 B2 | 8/2013 | Haba et al. |
| 8,525,327 B2 | 9/2013 | Crisp et al. |
| 8,610,260 B2 | 12/2013 | Crisp et al. |
| 8,629,545 B2 | 1/2014 | Crisp et al. |
| 8,653,646 B2 | 2/2014 | Crisp et al. |
| 8,654,663 B2 * | 2/2014 | Prasad ................ H04W 72/085 370/252 |
| 8,659,139 B2 | 2/2014 | Crisp et al. |
| 8,659,140 B2 | 2/2014 | Crisp et al. |
| 8,659,141 B2 | 2/2014 | Crisp et al. |
| 8,659,142 B2 | 2/2014 | Crisp et al. |
| 8,659,143 B2 | 2/2014 | Crisp et al. |
| 8,670,261 B2 | 3/2014 | Crisp et al. |
| 8,723,329 B1 | 5/2014 | Crisp et al. |
| 8,823,165 B2 | 9/2014 | Haba et al. |
| 8,902,680 B2 | 12/2014 | Yamamoto |
| 8,917,532 B2 | 12/2014 | Crisp et al. |
| 8,981,547 B2 | 3/2015 | Crisp et al. |
| 9,432,298 B1 | 8/2016 | Smith |
| 9,484,080 B1 | 11/2016 | Sun et al. |
| 2001/0002727 A1 | 6/2001 | Shiraishi et al. |
| 2001/0013662 A1 | 8/2001 | Kudou et al. |
| 2001/0022740 A1 | 9/2001 | Nuxoll et al. |
| 2001/0038106 A1 | 11/2001 | Coteus et al. |
| 2002/0000583 A1 | 1/2002 | Kitsukawa et al. |
| 2002/0016056 A1 | 2/2002 | Corisis |
| 2002/0027019 A1 | 3/2002 | Hashimoto |
| 2002/0030261 A1 | 3/2002 | Rolda et al. |
| 2002/0043719 A1 | 4/2002 | Iwaya et al. |
| 2002/0053727 A1 | 5/2002 | Kimura |
| 2002/0053732 A1 | 5/2002 | Iwaya et al. |
| 2002/0062430 A1 | 5/2002 | Brox et al. |
| 2002/0066950 A1 | 6/2002 | Joshi |
| 2002/0105096 A1 | 8/2002 | Hirata et al. |
| 2002/0130412 A1 | 9/2002 | Nagai et al. |
| 2002/0171142 A1 | 11/2002 | Kinsman |
| 2003/0064547 A1 | 4/2003 | Akram et al. |

(56) References Cited

U.S. PATENT DOCUMENTS

| | | |
|---|---|---|
| 2003/0089978 A1 | 5/2003 | Miyamoto et al. |
| 2003/0089982 A1 | 5/2003 | Feurle |
| 2003/0107118 A1 | 6/2003 | Pflughaupt et al. |
| 2003/0107908 A1 | 6/2003 | Jang et al. |
| 2003/0168748 A1 | 9/2003 | Katagiri et al. |
| 2003/0205801 A1 | 11/2003 | Baik et al. |
| 2003/0211660 A1 | 11/2003 | Lim et al. |
| 2004/0016999 A1 | 1/2004 | Misumi |
| 2004/0061211 A1 | 4/2004 | Michii et al. |
| 2004/0061577 A1 | 4/2004 | Breisch et al. |
| 2004/0084538 A1* | 5/2004 | Nishizawa ....... G06K 19/07732 235/492 |
| 2004/0090756 A1 | 5/2004 | Ho et al. |
| 2004/0112088 A1 | 6/2004 | Ueda et al. |
| 2004/0145042 A1 | 7/2004 | Morita et al. |
| 2004/0145054 A1 | 7/2004 | Bang et al. |
| 2004/0164382 A1 | 8/2004 | Gerber et al. |
| 2004/0168826 A1 | 9/2004 | Jiang et al. |
| 2004/0184240 A1 | 9/2004 | Su |
| 2004/0201111 A1 | 10/2004 | Thurgood |
| 2004/0245617 A1 | 12/2004 | Damberg et al. |
| 2005/0116358 A1 | 6/2005 | Haba |
| 2005/0194672 A1 | 9/2005 | Gibson et al. |
| 2005/0206585 A1 | 9/2005 | Stewart et al. |
| 2005/0243590 A1 | 11/2005 | Lee et al. |
| 2005/0258532 A1 | 11/2005 | Yoshikawa et al. |
| 2006/0004981 A1 | 1/2006 | Bains |
| 2006/0081983 A1 | 4/2006 | Humpston et al. |
| 2006/0087013 A1 | 4/2006 | Hsieh |
| 2006/0091518 A1 | 5/2006 | Grafe et al. |
| 2006/0170093 A1 | 8/2006 | Pendse |
| 2006/0192282 A1 | 8/2006 | Suwa et al. |
| 2006/0207788 A1 | 9/2006 | Yoon et al. |
| 2006/0290005 A1 | 12/2006 | Thomas et al. |
| 2007/0025131 A1 | 2/2007 | Ruckerbauer et al. |
| 2007/0108592 A1 | 5/2007 | Lai et al. |
| 2007/0120245 A1 | 5/2007 | Yoshikawa et al. |
| 2007/0143553 A1 | 6/2007 | LaBerge |
| 2007/0187836 A1 | 8/2007 | Lyne |
| 2007/0241441 A1 | 10/2007 | Choi et al. |
| 2007/0260841 A1 | 11/2007 | Hampel et al. |
| 2008/0012110 A1 | 1/2008 | Chong et al. |
| 2008/0052462 A1 | 2/2008 | Blakely et al. |
| 2008/0061423 A1 | 3/2008 | Brox et al. |
| 2008/0074930 A1 | 3/2008 | Kanda |
| 2008/0088030 A1 | 4/2008 | Eldridge et al. |
| 2008/0088033 A1 | 4/2008 | Humpston et al. |
| 2008/0098277 A1 | 4/2008 | Hazelzet |
| 2008/0150155 A1 | 6/2008 | Periaman et al. |
| 2008/0182443 A1 | 7/2008 | Beaman et al. |
| 2008/0185705 A1 | 8/2008 | Osborn et al. |
| 2008/0191338 A1 | 8/2008 | Park et al. |
| 2008/0230888 A1 | 9/2008 | Sasaki |
| 2008/0256281 A1 | 10/2008 | Fahr et al. |
| 2008/0265397 A1 | 10/2008 | Lin et al. |
| 2008/0284003 A1 | 11/2008 | Kwang et al. |
| 2009/0001574 A1 | 1/2009 | Fang et al. |
| 2009/0065948 A1 | 3/2009 | Wang |
| 2009/0108425 A1 | 4/2009 | Lee et al. |
| 2009/0140442 A1 | 6/2009 | Lin |
| 2009/0200680 A1 | 8/2009 | Shinohara et al. |
| 2009/0250255 A1 | 10/2009 | Shilling et al. |
| 2009/0250822 A1 | 10/2009 | Chen et al. |
| 2009/0273075 A1 | 11/2009 | Meyer-Berg |
| 2009/0294938 A1 | 12/2009 | Chen |
| 2009/0314538 A1 | 12/2009 | Jomaa et al. |
| 2010/0005366 A1 | 1/2010 | Dell et al. |
| 2010/0052111 A1 | 3/2010 | Urakawa |
| 2010/0090326 A1 | 4/2010 | Baek et al. |
| 2010/0102428 A1 | 4/2010 | Lee et al. |
| 2010/0148172 A1 | 6/2010 | Watanabe et al. |
| 2010/0182040 A1 | 7/2010 | Feng et al. |
| 2010/0244272 A1 | 9/2010 | Lee et al. |
| 2010/0244278 A1 | 9/2010 | Shen |
| 2010/0295166 A1 | 11/2010 | Kim |
| 2010/0301466 A1 | 12/2010 | Taoka et al. |
| 2010/0327457 A1 | 12/2010 | Mabuchi |
| 2011/0042824 A1 | 2/2011 | Koide |
| 2011/0084758 A1 | 4/2011 | Shibata et al. |
| 2011/0110165 A1 | 5/2011 | Gillingham et al. |
| 2011/0140247 A1 | 6/2011 | Pagaila et al. |
| 2011/0149493 A1 | 6/2011 | Kwon et al. |
| 2011/0193178 A1 | 8/2011 | Chang et al. |
| 2011/0193226 A1 | 8/2011 | Kirby et al. |
| 2011/0254156 A1 | 10/2011 | Lin |
| 2012/0018863 A1 | 1/2012 | Oganesian et al. |
| 2012/0020026 A1 | 1/2012 | Oganesian et al. |
| 2012/0153435 A1 | 6/2012 | Haba et al. |
| 2012/0155049 A1 | 6/2012 | Haba et al. |
| 2012/0203954 A1 | 8/2012 | Sun et al. |
| 2012/0206181 A1 | 8/2012 | Lin et al. |
| 2012/0217642 A1 | 8/2012 | Sun et al. |
| 2012/0217645 A1 | 8/2012 | Pagaila |
| 2012/0271990 A1 | 10/2012 | Chen et al. |
| 2012/0313239 A1 | 12/2012 | Zohni |
| 2012/0313253 A1 | 12/2012 | Nakadaira et al. |
| 2013/0009308 A1 | 1/2013 | Kwon |
| 2013/0009318 A1 | 1/2013 | Chia et al. |
| 2013/0015590 A1 | 1/2013 | Haba et al. |
| 2013/0082394 A1 | 4/2013 | Crisp et al. |
| 2013/0083583 A1 | 4/2013 | Crisp et al. |
| 2013/0168843 A1 | 7/2013 | Zohni |
| 2013/0286707 A1 | 10/2013 | Crisp et al. |
| 2013/0307138 A1 | 11/2013 | Crisp et al. |
| 2014/0042644 A1 | 2/2014 | Haba et al. |
| 2014/0055941 A1 | 2/2014 | Crisp et al. |
| 2014/0055942 A1 | 2/2014 | Crisp et al. |
| 2014/0055970 A1 | 2/2014 | Crisp et al. |
| 2014/0362629 A1 | 12/2014 | Crisp et al. |
| 2015/0043295 A1 | 2/2015 | Kim et al. |
| 2015/0048521 A1 | 2/2015 | Kwon et al. |
| 2016/0035703 A1 | 2/2016 | Sun et al. |

FOREIGN PATENT DOCUMENTS

| | | | |
|---|---|---|---|
| EP | 1205977 | A2 | 5/2002 |
| JP | 64-001257 | A | 1/1989 |
| JP | H11-087640 | | 3/1999 |
| JP | 2000196008 | A | 7/2000 |
| JP | 2000315776 | A | 11/2000 |
| JP | 2002076252 | A | 3/2002 |
| JP | 2002083897 | A | 3/2002 |
| JP | 2003051545 | A | 2/2003 |
| JP | 200063767 | A | 2/2004 |
| JP | 2004063767 | A | 2/2004 |
| JP | 2004152131 | A | 5/2004 |
| JP | 2005340724 | A | 12/2005 |
| JP | 2006310411 | A | 11/2006 |
| JP | 2007013146 | A | 1/2007 |
| JP | 2007149977 | A | 6/2007 |
| JP | 2008016666 | A | 1/2008 |
| JP | 2008135597 | A | 6/2008 |
| JP | 2008198841 | A | 8/2008 |
| JP | 2009182163 | A | 8/2009 |
| JP | 2010098098 | A | 4/2010 |
| JP | 2010282510 | A | 12/2010 |
| JP | 2011096268 | A | 5/2011 |
| JP | 2011155203 | A | 8/2011 |
| KR | 2001-0002214 | A | 1/2001 |
| KR | 2005-0119414 | A | 12/2005 |
| KR | 2006-0120365 | A | 11/2006 |
| KR | 2007-0088177 | A | 8/2007 |
| KR | 2009-0008341 | A | 1/2009 |
| KR | 2009-0086314 | A | 8/2009 |
| TW | 312044 | | 8/1997 |
| TW | 428258 | | 4/2001 |
| TW | 429561 | | 4/2001 |
| TW | 478137 | B | 3/2002 |
| TW | 567593 | B | 12/2003 |
| TW | M338433 | U | 8/2008 |
| TW | 200842998 | A | 11/2008 |
| TW | 200901194 | A | 1/2009 |
| TW | 200926312 | A | 6/2009 |
| TW | M363079 | U | 8/2009 |

(56) References Cited

FOREIGN PATENT DOCUMENTS

| TW | M398313 | 2/2011 |
|---|---|---|
| TW | 201115659 A | 5/2011 |
| TW | 201208004 | 2/2012 |
| TW | M426922 U | 4/2012 |
| TW | 201222684 | 6/2012 |
| TW | 201234556 A | 8/2012 |
| WO | 2010120310 A1 | 10/2010 |

OTHER PUBLICATIONS

Taiwanese Office Action for Application No. 101136585 dated Jan. 21, 2015.
Taiwanese Office Action for Application No. 101136594 dated Aug. 13, 2014.
Taiwanese Office Action for Application No. 101136595 dated Oct. 27, 2014.
Taiwanese Office Action for Application No. 101136606 dated Mar. 27, 2015.
Taiwanese Office Action for Application No. 102130519 dated May 7, 2015.
U.S. Appl. No. 61/1477,877, filed Apr. 21, 2011.
US Amendment for U.S. Appl. No. 13/439,299 dated Jan. 18, 2013.
US Amendment for U.S. Appl. No. 13/440,199 dated Nov. 30, 2012.
US Amendment for U.S. Appl. No. 13/440,280 dated Nov. 30, 2012.
U.S. Appl. No. 13/080,876, filed Apr. 6, 2011.
U.S. Appl. No. 13/306,300, filed Nov. 29, 2011.
U.S. Appl. No. 13/337,565, filed Dec. 27, 2011.
U.S. Appl. No. 13/337,575, filed Dec. 27, 2011.
U.S. Appl. No. 13/346,185, filed Jan. 9, 2012.
U.S. Appl. No. 13/439,228, filed Apr. 4, 2012.
U.S. Appl. No. 13/439,273, filed Apr. 4, 2012.
U.S. Appl. No. 13/439,299, filed Apr. 4, 2012.
U.S. Appl. No. 13/439,354, filed Apr. 4, 2012.
U.S. Appl. No. 13/440,199, filed Apr. 5, 2012.
U.S. Appl. No. 13/440,280, filed Apr. 5, 2012.
U.S. Appl. No. 13/440,290, filed Apr. 5, 2012.
U.S. Appl. No. 13/440,299, filed Apr. 5, 2012.
U.S. Appl. No. 13/440,515, filed Apr. 5, 2012.
U.S. Appl. No. 13/839,402, filed Mar. 15, 2013.
U.S. Appl. No. 13/840,353, filed Mar. 15, 2013.
U.S. Appl. No. 13/840,542, filed Mar. 15, 2013.
U.S. Appl. No. 13/841,052, filed Mar. 15, 2013.
U.S. Appl. No. 13/306,068, filed Nov. 29, 2011.
U.S. Appl. No. 13/346,201, filed Jan. 9, 2012.
U.S. Appl. No. 13/354,747, filed Jan. 20, 2012.
U.S. Appl. No. 13/354,772, filed Jan. 20, 2012.
U.S. Appl. No. 13/439,286, filed Apr. 5, 2012.
U.S. Appl. No. 13/439,317, filed Apr. 5, 2012.
U.S. Appl. No. 13/440,212, filed Apr. 5, 2012.
U.S. Appl. No. 13/440,313, filed Apr. 5, 2012.
US Non Final Office Action dated Oct. 18, 2012 for U.S. Appl. No. 13/439,299.
US Non-Final Office Action for U.S. Appl. No. 13/440,199 dated Aug. 31, 2012.
US Non-Final Office Action for U.S. Appl. No. 13/440,280 dated Aug. 31, 2012.
Written Opinion of the International Preliminary Examining Authority for Application No. PCT/US2014/041709 dated Jun. 1, 2015.
Chinese Office Action for Application No. 201280044481.5 dated Dec. 25, 2015.
Chinese Office Action for Application No. 201280044482.X dated Jan. 25, 2016.
Chinese Office Action for Application No. CN201280043482.8 dated Jan. 19, 2016.
Elpida User's Manual, "Introduction to GDDR5 SGRAM", Document No. E1600E10 (Ver. 1.0), Published Mar. 2010, Japan, URL: http:'www.elpida.com.
Hlynix, "2GB (64Mx32) GDDR5 SGRAM HRGQ2H24AFR", Nov. 2011-Feb. 2012.
International Search Report and Written Opinion dated Mar. 21, 2013 for Application No. PCT/US2012/000425.
International Search Report and Written Opinion dated Mar. 21, 2013 for Application No. PCT/US2012/057911.
International Search Report and Written Opinion for Application No. PCT/US2012/046049 dated Jan. 10, 2013.
International Search Report and Written Opinion for Application No. PCT/US2012/046049 dated Nov. 29, 2012.
International Search Report and Written Opinion for Application No. PCT/US2012/046249 dated Mar. 20, 2013.
International Search Report and Written Opinion for Application No. PCT/US2012/046255 dated Mar. 20, 2013.
International Search Report and Written Opinion for Application No. PCT/US2012/057170 dated Mar. 22, 2013.
International Search Report and Written Opinion for Application No. PCT/US2012/057179 dated Apr. 4, 2013.
International Search Report and Written Opinion for Application No. PCT/US2012/057200 dated Mar. 1, 2013.
International Search Report and Written Opinion for Application No. PCT/US2012/057204 dated Aug. 30, 2013.
International Search Report and Written Opinion for Application No. PCT/US2012/057554 dated Feb. 28, 2013.
International Search Report and Written Opinion for Application No. PCT/US2012/057563 dated Mar. 5, 2013.
International Search Report and Written Opinion for Application No. PCT/US2012/057810 dated Jul. 23, 2013.
International Search Report and Written Opinion for Application No. PCT/US2012/058273 dated Mar. 6, 2013.
International Search Report and Written Opinion for Application No. PCT/US2012/058398 dated Jul. 4, 2013.
International Search Report and Written Opinion for Application No. PCT/US2012/058407 dated Mar. 28, 2013.
International Search Report and Written Opinion for Application No. PCT/US2012/058423 dated Mar. 20, 2013.
International Search Report and Written Opinion for Application No. PCT/US2012/058434 dated Jun. 21, 2013.
International Search Report and Written Opinion for Application No. PCT/US2012/058557 dated Mar. 12, 2013.
International Search Report and Written Opinion for Application No. PCT/US2013/056773 dated Dec. 4, 2013.
International Search Report and Written Opinion for Application No. PCT/US2013/056777 dated Jan. 21, 2015.
International Search Report and Written Opinion for Application No. PCT/US2014/041709 dated Nov. 4, 2014.
International Search Report and Written Opinion for Application No. PCT/US2015/042726 dated Nov. 12, 2015.
International Search Report and Written Opinion for Application No. PCT/US2012/057895 dated Jun. 10, 2013.
International Search Report and Written Opinion for Application No. PCT/US2012/058229 dated Jul. 3, 2013.
International Search Report and Written Opinion for Application PCT/US2013/056777 dated Jan. 2, 2014.
International Search Report for Application No. PCT/US2012/057173 dated Aug. 5, 2013.
International Search Report for Application No. PCT/US2012/057905 dated Aug. 20, 2013.
Kang, et al., 8Gb 3D DDR3 DRAM Using Through-Silicon-Via Technology, IEEE, International Solid-State Circuits Conference, 2009, pp. 130-132.
Kang, et al., 8Gb 3D DDR3 DRAM Using Through-Silicon-Via Technology, IEEE, International Solid-State Circuits Conference, 2009, Samsung Electronics, Hwasung, Korea.
Office Action from Taiwan for Application No. 101125197 dated May 19, 2014.
Partial International Search Report dated Oct. 12, 2012 in International Patent Appl. No. PCT/US2012/046249.
Partial International Search Report dated Oct. 12, 2012 in International Patent Appl. No. PCT/US2012/046255.
Partial International Search Report dated Oct. 26, 2012 in International Patent Appl. No. PCT/US2012/046049.

(56) References Cited

OTHER PUBLICATIONS

Partial Search Report for Application No. PCT/US2012/000425 dated Jan. 30, 2013.
Partial Search Report for Application No. PCT/US2012/057170 dated Jan. 31, 2013.
Partial Search Report for Application No. PCT/US2012/057554 dated Jan. 24, 2013.
Partial Search Report for Application No. PCT/US2012/058273 dated Jan. 24, 2013.
Partial Search Report for Application No. PCT/US2012/058557 dated Feb. 4, 2013.
Sandforce, "SF-2200 & SF-2100 Client SSD Processors", 2011.
Taiwanese Allowance and Search Report for Application No. 101136592 dated Jun. 27, 2014.
Taiwanese Notice of Allowance for Application No. 102130518 dated Mar. 31, 2015.
Taiwanese Office Action for Application No. 101125193 dated Aug. 4, 2015.
Taiwanese Office Action for Application No. 101136575 dated Oct. 28, 2014.
Taiwanese Office Action for Application No. 101136577 dated May 12, 2015.

* cited by examiner

COMPACT MICROELECTRONIC ASSEMBLY HAVING REDUCED SPACING BETWEEN CONTROLLER AND MEMORY PACKAGES

BACKGROUND OF THE INVENTION

Field of the Invention

The subject matter of the present application relates to microelectronic packages and assemblies, particularly in a context of assemblies which occupy reduced space of a circuit panel, e.g., a motherboard.

Description of the Related Art

Semiconductor chips are commonly provided as individual, prepackaged units. A standard chip has a flat, rectangular body with a large front face having contacts connected to the internal circuitry of the chip. Each individual chip typically is contained in a package having external terminals connected to the contacts of the chip. In turn, the terminals, i.e., the external connection points of the package, are configured to electrically connect to a circuit panel, such as a printed circuit board. In many conventional designs, the chip package occupies an area of the circuit panel considerably larger than the area of the chip itself. As used in this disclosure with reference to a flat chip having a front face, the "area of the chip" should be understood as referring to the area of the front face.

Size is a significant consideration in any physical arrangement of chips. The demand for more compact physical arrangements of chips has become even more intense with the rapid progress of portable electronic devices. Merely by way of example, devices commonly referred to as "smart phones" integrate the functions of a cellular telephone with powerful data processors, memory and ancillary devices such as global positioning system receivers, electronic cameras, and local area network connections along with high-resolution displays and associated image processing chips. Such devices can provide capabilities such as full internet connectivity, entertainment including full-resolution video, navigation, electronic banking and more, all in a pocket-size device. Complex portable devices require packing numerous chips into a small space. Moreover, some of the chips have many input and output connections, commonly referred to as "I/Os." These I/Os must be interconnected with the I/Os of other chips. The components which form the interconnections should not greatly increase the size of the assembly. Similar needs arise in other applications as, for example, in data servers such as those used in internet search engines where increased performance and size reduction are needed.

Semiconductor chips containing memory storage arrays, particularly dynamic random access memory chips (DRAMs) and flash memory chips are commonly packaged in single- or multiple-chip packages and assemblies. Each package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

As manufacturers of smartphones, tablets and other devices constantly seek increased performance and greater circuit density the trend for these devices is to provide ever greater functional capabilities in an amount of space on a circuit panel that may stay the same or decrease over time. In light of the foregoing, certain improvements can be made in the structure of microelectronic packages and assemblies which comprise a microelectronic package having a memory controller function, or "controller package" as further defined herein. Such improvements may help reduce an amount of space of a circuit panel, e.g., motherboard occupied by the controller and memory packages when such controller and memory packages are mounted in close proximity to one another at non-overlapping areas of the circuit panel.

SUMMARY OF THE INVENTION

Accordingly, an aspect of the invention provides a microelectronic package configured to provide multiple channel memory access. Such package may comprise a substrate having first and second opposite surfaces, the first surface having third and fourth corners opposite one another along a first diagonal of the first surface, and first and second corners opposite one another along a second diagonal of the first surface transverse to the first diagonal. The first diagonal may divide the first surface in first and second half areas each extending from the first diagonal to one of the first corner or the second corner. The substrate can include a plurality of terminals at the first surface, the terminals including first terminals configured to carry data and second terminals configured to carry address information. In such package, the first terminals and the second terminals in the first half area can provide access to a first memory storage array corresponding to a first memory channel, and the first terminals and the second terminals in the second half area can provide access to a second memory storage array corresponding to a second memory channel different from the first memory channel. The microelectronic package may include first and second microelectronic elements overlying the second surface and stacked in first and second orientations transverse to one another, the first and second microelectronic elements comprising the first and second memory storage arrays.

In accordance with one or more further aspects of the invention, the first microelectronic element may comprise the first memory storage array and the second microelectronic element comprises the second memory storage array.

In accordance with one or more further aspects of the invention, each of the microelectronic elements can have a face parallel to the second surface, edges bounding the face, and contacts at the face. The contacts of each microelectronic element may include first peripheral contacts at or near a first one of the edges. The first contacts can be configured to carry data. Second peripheral contacts which can be at or near a second one of the edges opposite the first edge can be configured to carry address information.

In accordance with one or more further aspects of the invention, the first terminals and the second terminals corresponding to the first memory channel can be coupled to the first contacts and the second contacts of the first microelectronic element, respectively, and the first terminals and the second terminals corresponding to the second memory channel can be coupled to the first contacts and the second contacts of the second microelectronic element, respectively.

In accordance with one or more further aspects of the invention, geometric distances between the second contacts of each microelectronic element and the second terminals coupled thereto for the corresponding channel can be longer than the geometric distances between the second contacts of each microelectronic element and the second terminals of the non-corresponding channel which are not coupled thereto.

In accordance with one or more further aspects of the invention, the second contacts of each microelectronic element can be aligned with the half area at which the non-coupled second terminals of the non-corresponding memory channel are disposed.

In accordance with one or more further aspects of the invention, the second contacts of each microelectronic element can be aligned with the half area which can be opposite from the half area at which the corresponding second terminals coupled thereto can be disposed.

In accordance with one or more further aspects of the invention, each half area can be further defined by first and second quarter area portions thereof extending between third and fourth corners, respectively, and a second diagonal of the package extending between the first and second corners, wherein the first terminals in each half area can be disposed in the first quarter area portion, and the second terminals in each half area span the second diagonal.

In accordance with one or more further aspects of the invention, each half area can be further defined by first and second quarter area portions thereof extending between third and fourth corners, respectively, and a second diagonal of the package extending between the first and second corners, wherein the first terminals in each half area can be disposed in the first quarter area portion, and the second terminals in each half area can be disposed in the second quarter area portion.

In accordance with one or more further aspects of the invention, the package can be configured to provide access to a third memory storage array corresponding to a third memory channel, and to a fourth memory storage array corresponding to a fourth memory channel different from each of the first, second and third memory channels. Each half area can be further defined by first and second quarter area portions thereof extending between third and fourth corners, respectively, and a second diagonal of the package extending between the first and second corners, wherein the first terminals and the second terminals disposed in each quarter area portion can be configured to provide access to a single one of the first, second, third and fourth memory channels.

Another aspect of the invention provides a microelectronic assembly which comprises a controller package comprising a microelectronic element having a memory controller function. Such "controller" microelectronic element can be electrically coupled with a substrate having controller package terminals at a surface thereof. As used herein, a "controller package" shall mean a microelectronic package comprising a microelectronic element having a memory controller function which, alone or in combination with other microelectronic elements, functions as a memory controller. Typically, a controller package comprises a "controller" microelectronic element which may be a "CPU" or processor microelectronic element; however, a controller package may alternatively comprise a microelectronic element which is not a CPU or a processor microelectronic element. For example, the controller package may comprise a memory controller microelectronic element. As used herein, a "controller chip package" shall mean a "controller package."

The assembly may further comprise a memory package having a memory microelectronic element, which can be electrically coupled with a substrate having memory package terminals at a surface thereof. The controller and memory packages can be assembled with a circuit panel at laterally separate, adjacent first and second non-overlapping areas of a same surface of the circuit panel and can be electrically coupled with one another through their respective terminals and the circuit panel therebetween. At least portions of the adjacent edges of the respective packages can be less than two millimeters apart. Typically, adjacent edges of the respective packages are parallel to one another and a majority of the length of the edge of the memory package is spaced less than two millimeters from the adjacent parallel edge of the controller package.

In accordance with one or more further aspects of the invention, the controller package comprises controller contacts at a face of the controller microelectronic element and package traces coupled between the controller package terminals and the controller contacts. The memory package comprises memory element contacts at a face of the memory microelectronic element and package traces coupled between the memory package terminals and the memory element contacts. In such assembly, a range of total electrical lengths defined by the respective interconnections between the controller contacts and the memory element contacts is within a permitted tolerance therefor, and a range of total electrical lengths defined by the interconnections between the memory element contacts and the memory package terminals is outside the permitted tolerance.

In accordance with one or more further aspects of the invention, the memory element contacts can include first memory element contacts configured to carry first address information for a first memory channel and second memory element contacts configured to carry second address information for a second memory channel separately accessible from the first memory channel. In such assembly, the range of total electrical lengths of the connections between the controller contacts and the first memory element contacts are within a permitted first tolerance, and the range of total electrical lengths of the connections between the controller contacts and the second memory element contacts are within a permitted second tolerance different from the permitted first tolerance.

In accordance with one or more further aspects of the invention, the lengths of the interconnections along the circuit panel between the controller package terminals and the memory package terminals can be the shortest possible for the spacing between the microelectronic packages.

In accordance with one or more further aspects of the invention, the controller package comprises package traces coupled between the controller package terminals and the controller contacts, and the memory package comprises package traces coupled between the memory package terminals and memory element contacts. In such assembly, a range of total electrical lengths defined by the respective interconnections between the controller contacts and the memory element contacts are within a permitted tolerance, and a range of total electrical lengths defined by the interconnections between the memory package terminals and the memory element contacts are outside the permitted tolerance.

In accordance with one or more further aspects of the invention, the electrical length of each of a plurality of first interconnections usable to transfer a first type of signals from the controller contacts to respective memory element are within a single permitted tolerance for transferring the first type of signals therebetween. However, the electrical lengths of some of the traces on the memory package corresponding to the first interconnections are longer than others of the traces on the memory package so as to compensate for portions of the first interconnections on the circuit panel which are shorter than other portions of the first interconnections on the circuit panel.

In accordance with one or more further aspects of the invention, the first interconnections can be configured to transfer each of at least 16 data signals of a memory channel per memory cycle.

In accordance with one or more further aspects of the invention, the first interconnections can be configured to transfer address information of a memory channel which is usable to specify an addressable location of a memory storage array of the memory microelectronic element.

In accordance with one or more further aspects of the invention, the memory package terminals can be at a first surface of the substrate thereof. The first surface can have first and second half areas extending from a diagonal bisecting the first surface and a respective opposite corner of the first surface. The memory package terminals can include first terminals configured to carry data and second terminals configured to carry address information, the first terminals. The second terminals in the first half area can provide access to a first memory storage array corresponding to a first memory channel, and the first terminals and the second terminals in the second half area can provide access to a second memory storage array corresponding to a second memory channel different from the first memory channel. The memory element can comprise first and second microelectronic elements overlying the second surface and stacked in first and second orientations transverse to one another. The first and the second microelectronic elements can comprise the first and second memory storage arrays.

In accordance with one or more further aspects of the invention, each of the microelectronic elements may have a face parallel to the second surface, edges bounding the face, and contacts at the face. The contacts of each microelectronic element can include first peripheral contacts at or near a first one of the edges, the first contacts configured to carry data, and second peripheral contacts at or near a second one of the edges opposite the first edge, the second contacts configured to carry address information.

In accordance with one or more further aspects of the invention, the first terminals and the second terminals corresponding to the first memory channel can be coupled to the first contacts and the second contacts of the first microelectronic element, respectively, and the first terminals and the second terminals corresponding to the second memory channel can be coupled to the first contacts and the second contacts of the second microelectronic element, respectively.

In accordance with one or more further aspects of the invention, geometric distances between the second contacts of each microelectronic element and the second terminals coupled thereto for the corresponding channel may be generally longer than the geometric distances between the second contacts of each microelectronic element and the second terminals of the non-corresponding channel which are not coupled thereto.

In accordance with one or more further aspects of the invention, the second contacts of each microelectronic element can be aligned with the half area at which the non-coupled second terminals of the non-corresponding memory channel are disposed.

Another aspect of the invention provides a microelectronic assembly. Such assembly can comprise a controller package which can include, for example, a microelectronic element having a memory controller function, such microelectronic element electrically coupled with a substrate having controller package terminals at a surface thereof. The assembly may include a memory package, and the memory package may have a substrate and memory package terminals at a first surface of the substrate. First and second microelectronic elements may overlie a second surface of the substrate opposite from the first surface, the first and second microelectronic elements stacked in first and second orientations transverse to one another. The microelectronic elements can comprise first and second memory storage arrays, respectively. The substrate of the memory package may have a first surface having first and second half areas extending from a diagonal bisecting the first surface and a respective opposite corner of the first surface. The memory package terminals may include first terminals configured to carry data and second terminals configured to carry address information. The first terminals and the second terminals in the first half area can be configured to provide access to a first memory storage array corresponding to a first memory channel, and the first terminals and the second terminals in the second half area can be configured to provide access to a second memory storage array corresponding to a second memory channel different from the first memory channel. The controller package and the memory package can be assembled with a circuit panel at laterally separate, adjacent first and second non-overlapping areas of a same surface of the circuit panel and can be electrically coupled with one another through their respective terminals and the circuit panel therebetween. At least portions of the adjacent edges of the respective packages can be less than two millimeters apart. Geometric distances between the second contacts of each microelectronic element and the second terminals coupled thereto for the corresponding channel may be generally longer than the geometric distances between the second contacts of each microelectronic element and the second terminals of the non-corresponding channel which is not coupled thereto.

BRIEF DESCRIPTION OF THE SEVERAL VIEWS OF THE INVENTION

DETAILED DESCRIPTION

Relatively new device types such as smartphones and tablets have a need for ever-increasing performance and reduced component size. While the trend towards ever-increasing circuit density on processor chips, memory chips, and other types of integrated circuit chips are a positive development, the sizes of circuit panels or circuit boards also need to be reduced to meet this need. However, traditional microelectronic assemblies which incorporate a microelectronic package or "controller package" having a memory controller function, a memory package including a memory chip, and a circuit panel, e.g., motherboard, to which the packages are mounted and electrically connected, require significant circuit panel space for routing traces between the controller and memory packages.

Figure 1:
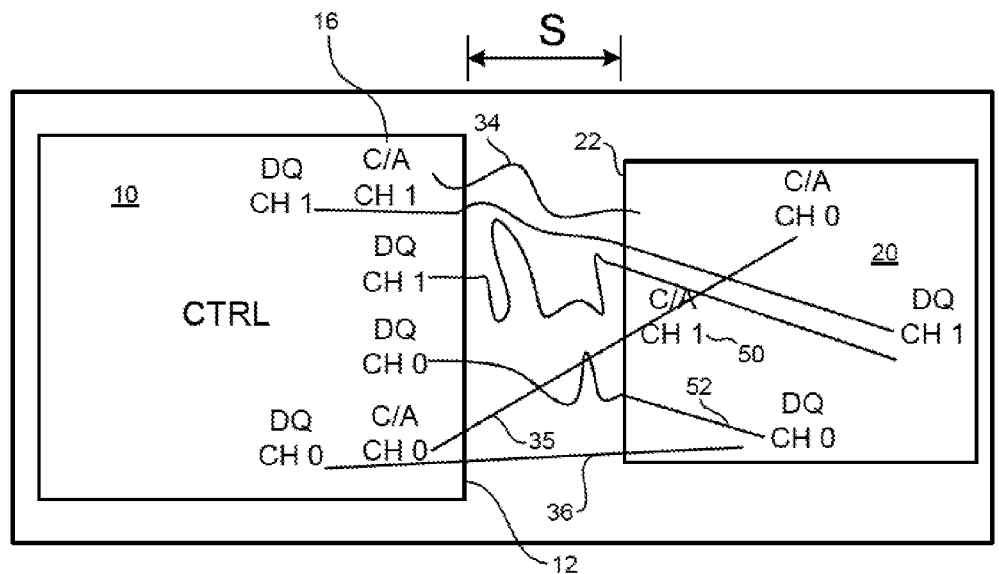
FIG. 1 is a top plan view of a microelectronic assembly in accordance with an example described herein.

For example, in the example shown in FIG. 1, the closest adjacent edges 12, 22 of a controller chip package 10 and a memory chip package 20, respectively, typically are parallel to one another and may be spaced apart from one another by a relatively wide spacing "S". The spacing S typically ranges between 20 and 40, however, the spacing S may range up to dozens of millimeters on a circuit board 30 to which the packages are mounted and electrically interconnected. The spacing S typically accommodates the lengths of traces routed on the circuit panel that may be needed to provide trace length matching for specific types of interconnections between the controller chip and the memory chip. Thus, FIG. 1 depicts several panel traces 34 on the circuit panel 30 which have been lengthened by the addition of jogs therein. The lengthened panel traces 34 compensate for differences in the total electrical lengths of the interconnections between the controller chip and memory chip, where the distances covered by other interconnections, such as interconnections 35 and 36, are longer.

At frequencies of operation of up to 800 MHz at which available "double-data rate two" (DDR2) standard memory buses between controller chips and existing memory chips operate, relatively few and small adjustments to the trace lengths on the motherboard have been required. Differences in the phase or arrival time of signals transmitted between a controller chip package and a memory chip package that stem from differences in the total electrical lengths of the interconnections between the controller chip and the memory chip heretofore have been relatively tolerable. Such phase shifts are a function of the wavelength $\lambda$, and the wavelength $\lambda$ is determined by the speed of light divided by the frequency, i.e., $\lambda = C/f$. However, at higher memory data bus rates or speeds currently ranging to 1,600 MHz and 3,000 MHz at which "double-data rate three" (DDR3), "double-data rate four" (DDR4) and "low-power double-data rate" (LPDDRx) standards operate, the tolerance for the differences in the electrical interconnections between the controller chip and memory chip can be reduced significantly. For example, when the memory bus rate is tripled from 1000 MHz to 3,000 MHz, this typically causes the tolerance for differences in the total electrical lengths of interconnections shrinks by two-thirds.

Reducing an overall area of the circuit panel shown in FIG. 1 can be problematic because of the space on the circuit panel required for routing traces and adjusting their lengths to address the above-noted concerns. In the embodiments of the invention disclosed herein, an amount of non-overlapping space of a surface of a circuit panel occupied by a controller package and a memory package electrically coupled thereto can be reduced well below that which has been traditionally provided. As a result, the embodiments provided herein facilitate reductions in the overall area of the circuit panel.

Communication of information between the controller chip package 10 and the memory chip package 20 is provided through a plurality of corresponding terminals provided at a surface of the controller chip package, and a plurality of terminals provided at a surface of the memory chip package. As used in this disclosure with reference to a component, e.g., an interposer, microelectronic element, circuit panel, substrate, etc., a statement that an electrically conductive element is "at" a surface of a component indicates that, when the component is not assembled with any other element, the electrically conductive element is available for contact with a theoretical point moving in a direction perpendicular to the surface of the component toward the surface of the component from outside the component. Thus, a terminal or other conductive element which is at a surface of a substrate may project from such surface; may be flush with such surface; or may be recessed relative to such surface in a hole or depression in the substrate.

In such memory package 20, terminals denoted "C/A CH 0" and "C/A CH 1" which carry command and address bus information for first and second memory channels, respectively, are disposed in relative close proximity to corresponding contacts denoted "C/A CH 0" and "C/A CH 1" on first and second corresponding memory chips 40, 42 in the package. In this way, within the memory chip package 20 the trace lengths of the interconnections between the CA CH 0 terminals and the CA CH 0 contacts of first memory chip 40 may be matched, i.e., kept within a permitted tolerance, and the trace lengths of the interconnections between the CA CH 1 terminals on the memory chip package 20 and the CA CH 1 contacts of the second memory chip 42 may be kept within a permitted tolerance. As used herein in connection with the lengths of specific types of electrical interconnections, "permitted tolerance" means that range of the lengths which is permitted by design rule given the type of signal carried by the electrical interconnection, the electrical characteristics of the circuit panels and microelectronic packages involved and the operating frequency. For example, in a system having a circuit panel, a controller chip package, and a memory chip package with a DDRx or LPDDRx type memory channel architecture thereon operating at a frequency of 1,600 MHz, and a dielectric constant K of the circuit panel being about 4, the effective wavelength λ for signals propagating along traces of the circuit panel or package is about 94 millimeters. In that system, a design rule provided by a manufacturer of the controller chip requires that the total lengths of the electrical interconnections carrying specific clock signals in either direction between the controller chip and memory chip range within a permitted tolerance of less than 10 mils, or about 0.254 millimeters. This value is about one quarter of one percent of the wavelength of the signal, i.e., in this example, one quarter of one percent of the 94 millimeter wavelength determined above at an operating frequency of 1,600 MHz. For types of signals other than clock, the permitted tolerance may be a greater percentage of the total wavelength, as permitted by a somewhat more relaxed design rule. Data signals in either direction and address signals provided as input to the memory chip typically fall into this category. Typically, the permitted tolerance for the lengths of the electrical interconnections between the controller chip and memory chip in the system will range up to a maximum of 5% of the wavelength in either direction between the controller chip and memory chip.

Within the memory chip package 20 the trace lengths of the interconnections between the DQ CH 0 data terminals and the DQ CH 0 data contacts of chip 40 may be matched, i.e., kept within a permitted tolerance, and the trace lengths of the interconnections between the DQ CH 1 data terminals on the memory chip package 20 and the DQ CH 1 data contacts of chip 42 may be kept within a permitted tolerance.

Figure 2:
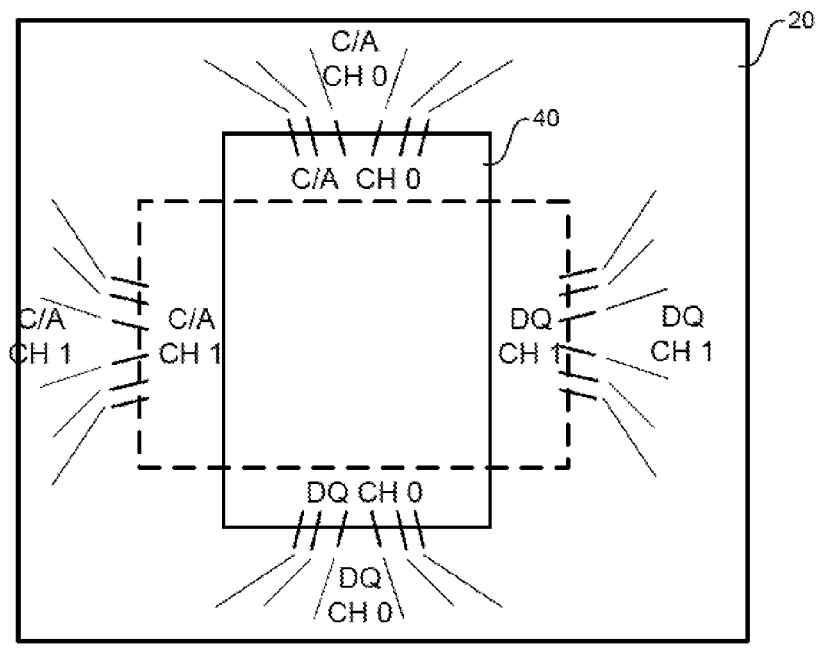
FIG. 2 is a top plan view of an internal arrangement of a memory package in accordance with an example described herein.

As further seen in FIGS. 1 and 2, a typical memory chip package 20 that can be used in the assembly of FIG. 1 has features that require a relatively large spacing S between the controller chip package 10 and the memory chip package. The memory chip package 20 is designed such that, for specific types of signals, the lengths of the electrical interconnections between the terminals of the package 20 and the corresponding contacts of the memory chip(s) in the package are within a permitted tolerance as defined above. For example, the lengths of the electrical interconnections on the memory chip package 20 between the "DQ CH0" terminals of the memory chip package 20 and the "DQ CH0" contacts of memory chip 40 can be designed to within the same permitted tolerance.

Even though the electrical lengths of the interconnections between groups of terminals on the memory chip package and the data contacts of each memory chip within the memory chip package can be matched, the electrical lengths of the external interconnections that extend between the terminals on the controller chip package and the terminals of the memory chip package must also be matched. This is because some of the external interconnections between some of the controller package terminals and some of the memory package terminals in each group extend over relatively short "geometric", i.e., straight line distances, while other controller package terminals and memory package terminals in the same group extend over longer geometric distances. For example, the geometric distances between C/A CH 1 terminals on the controller chip package and the corresponding C/A CH 1 terminals on the memory chip package vary greatly. The C/A CH 1 terminals on the memory chip package at location 50 are at much smaller geometric distances from the C/A CH 1 terminals on the controller chip package than the C/A CH 1 terminals on the memory chip package at location 52. Thus, in the example shown in FIG. 1, the trace lengths on the circuit panel must be increased for some of the external interconnections between the controller chip package terminals and the corresponding memory chip package terminals to adjust for the different geometric distances between specific interconnected terminals and thereby bring the lengths of the interconnections between the controller chip and the memory chip within the permitted tolerances therefor.

In addition, as can be further seen in FIG. 1, the controller package terminals in the C/A CH 0 group are at relatively long geometric distances from the corresponding C/A CH 0 memory package terminals, while the controller package terminals in the C/A CH 1 group and the corresponding C/A CH 1 group memory package terminals are at relatively close geometric distances. Such arrangement too can necessitate increasing the lengths of some of the traces on the circuit panel to address the differences in the geometric distances between the terminals of the two packages.

In view of the foregoing, in a microelectronic assembly 100 (FIG. 3) provided according to the embodiment of the invention, a controller chip package 110 and a memory chip package 120 as provided herein which can be mounted adjacent to one another on a circuit panel 130 at a reduced spacing R between portions of the closest edges 112, 122 that is much smaller than the spacing S required in the microelectronic assembly shown in FIG. 1. The reduced spacing R between the packages 110, 120 is made possible because a larger spacing on the circuit panel is not required to provide matched lengths of the external interconnections between the controller package terminals and the memory package terminals. Thus, in a particular example, portions of parallel closest adjacent edges 112, 122 of the packages may be positioned at a spacing R which is as small as a mechanical limit at which the packages may be reliably mounted and used over the life of the product. In one example, the mechanical limit may have a value ranging from zero to two millimeters. Typically, adjacent edges of the respective packages are parallel to one another and a majority of the length of the edge 122 of the memory package 120 is spaced less than two millimeters from the adjacent parallel edge 112 of the controller package 110.

Thus, the spacing between closest adjacent edges 112, 122 of the packages is not determined by an amount of circuit panel area required to accommodate additional jogs in the board traces thereon to provide package to package interconnections having matched trace lengths.

Factors contribute to or determine the mechanical limit may include the smallest spacing at which equipment is capable of positioning or "placing" the packages 110, 120 on the circuit panel, and at which the packages can then be mounted thereto by melting and solidifying conductive metal joining elements for example. In addition, the mechanical limit may also account for an acceptable degree of misalignment in the position of each package on the circuit panel. For example, the mechanical limit may be determined in part by permitted misalignment which results in the edges 112, 122 of the adjacent packages being slightly out of parallel, where portions of the edges 112, 122 are closer than other portions of the edges. Also, in some cases, the mechanical limit is at least as large as a smallest spacing between packages 110, 120 which would permit typical rework, that is, a smallest spacing which would permit one or both of the mounted packages 110, 120 to be removed from its respective position mounted to the circuit panel and replaced by another package 110 or 120 having a same footprint or substantially the same footprint as that of the package being replaced. In addition, the mechanical limit may need to accommodate changes in the positions of the edges 112, 122 of the adjacent packages due to differential thermal expansion over an entire range of very cold to very hot temperatures and conditions (e.g., −54° C. to 100° C.) at which the microelectronic assembly 100 may be expected to be stored and operated during its lifetime.

With the reduced spacing R between the closest edges 112, 122 of the adjacent packages 110, 120, the lengths of the electrical interconnections between terminals of the controller package (e.g., terminals 170 in FIG. 4) and the terminals of the memory package (e.g., terminals 150 in FIG. 5) can be made the shortest possible for the spacing R. Stated another way, the electrical interconnections between the controller package terminals and the memory package terminals can be determined by direct straight line routing rather than by routing which includes extra jogs, such as would be needed if trace length compensation had to be provided on the circuit panel.

Figure 3:
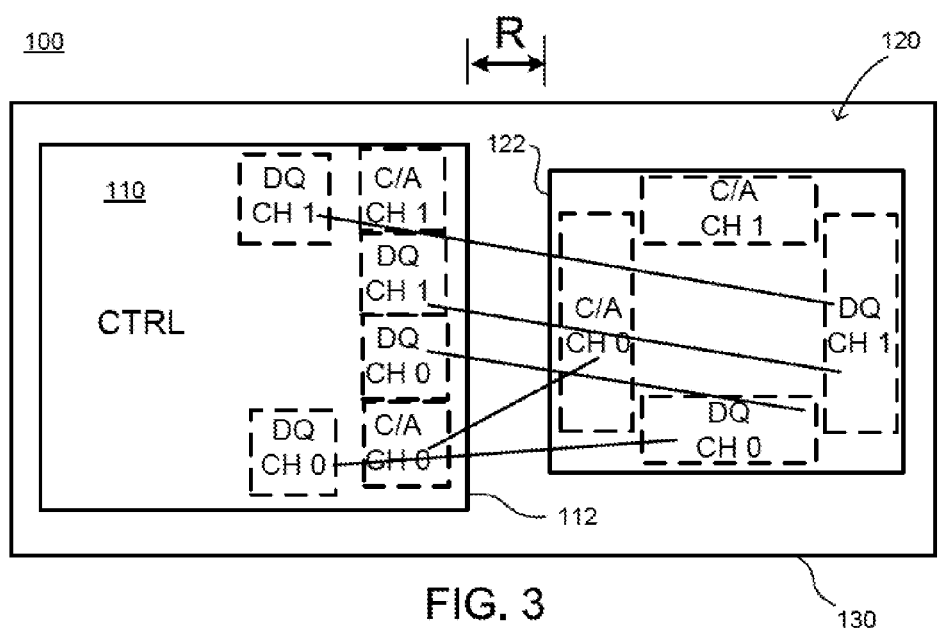
FIG. 3 is a top plan view of a microelectronic assembly in accordance with one embodiment.

As further seen in FIG. 3, the controller chip package 110 can have the same arrangement of terminals as the above-described controller chip package 10, wherein controller package terminals for each of two memory channels are arranged in groups disposed at a surface of the controller package, with the controller package terminals which carry command and address bus information arranged in the groups labeled "C/A CH 0" for a first memory channel ("channel 0") and "C/A CH 1" for a second memory channel ("channel 1"). In one example, the address information carried by each such group of terminals is sufficient to specify an addressable memory location within a memory storage array of a microelectronic element in the memory chip package 120. In another example, the address information carried by each such group of terminals may contain a majority of the information needed to specify an addressable memory location within a memory storage array of a microelectronic element in the memory chip package 120. Groups of data terminals may include a group DQ CH 0 which is configured to transfer each of the data signals of a first memory channel per a memory cycle, and another group DQ CH 1 which is configured to transfer each of the data signals of a second memory channel per a memory cycle. In one example, each group DQ CH 0 or DQ CH 1 can be configured to transfer at least 16 data signals per memory cycle.

In the memory chip package 120 shown in FIG. 3, the terminal groups C/A CH 0, C/A CH 1, DQ CH 0 and DQ CH 1 are also provided. In one example, the address information for a memory channel carried by the group C/A CH 0 terminals or the group C/A CH 1 terminals is sufficient to specify an addressable memory location within a memory storage array of a microelectronic element in the memory chip package 120. In another example, the address information carried by each such group of terminals may contain a majority of the information needed to specify an addressable memory location within a memory storage array of a microelectronic element in the memory chip package 120.

Figure 4:
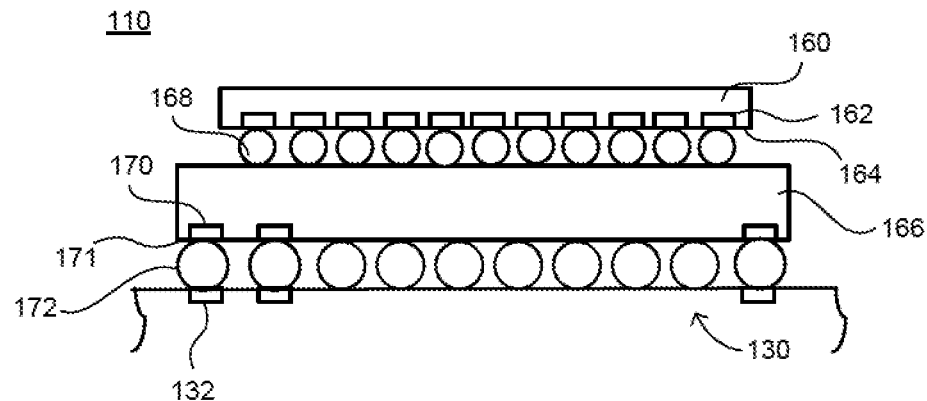
FIG. 4 is a sectional view of a memory package in accordance with an embodiment.

As seen in FIG. 4, in an exemplary controller chip package 110, a microelectronic element or controller chip 160 can be "flip-chip" mounted on a substrate 166 of the package. Specifically, the controller chip 160 has a plurality of contacts 162 at a face 164 of the controller chip which are electrically coupled to a substrate 166 of the controller chip package 110. As used herein, unless otherwise specified, a "chip" and a "microelectronic element" each denotes either a bare semiconductor chip or a semiconductor chip having additional conductive structure thereon which may include an electrically conductive redistribution layer electrically coupled with contacts of the semiconductor chip and which is disposed partially or fully on a face of the semiconductor chip. In one example, the controller chip contacts 162 can face and be electrically connected with corresponding contacts (not shown) of the substrate 166 through electrically conductive bumps 168, which may comprise masses of electrically conductive material such as solder and/or which may comprise any of a variety of columnar connectors such as metal posts (e.g., micropillars), stud bumps or other form of connection. Terminals 170 are typically provided at a surface 171 of the substrate 166 which faces away from the controller chip 160, the terminals 170 being suitable for electrical connection with corresponding contacts at a surface of a circuit panel 130 (FIG. 3) which face the terminals 170 and are electrically connected therewith, such as through joining elements 172 such as solder balls. As further seen in FIG. 3, the terminals 170 of the controller chip package 110 are typically arranged in terminal groups disposed in corresponding locations at surface 171 of the package. The positions of the terminal groups on the controller chip package can be as shown in FIG. 3, where the groups comprise "DQ CH 0", "DQ CH 1", "C/A CH 0" and "C/A CH 1".

Figure 5:
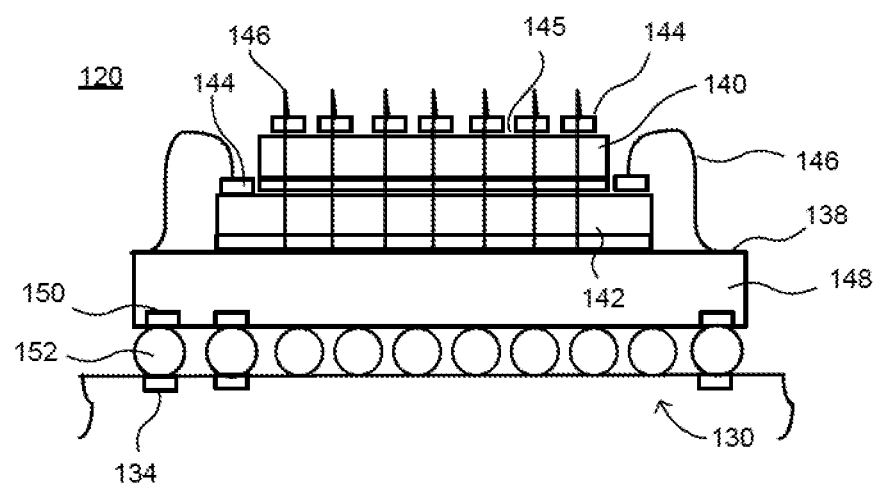
FIG. 5 is a sectional view of a memory package in accordance with an embodiment.

Referring to FIG. 5, the memory chip package 120 may have a somewhat different structure from the controller chip package. In the example seen in FIG. 5, the memory chip package 120 comprises a first memory chip 140 or first memory microelectronic element, and a second memory chip 142 or second memory microelectronic element. Here, the chips 140, 142 may be disposed face-up, with the element contacts 144 (also referred to herein as "chip contacts") on a face 145 of each chip facing up, i.e., in a direction away from an upper surface 138 of the substrate 148 of the memory chip package. The chips 140, 142 are stacked in transverse, e.g., orthogonal, orientations relative to one another, such that the element contacts 144 on the face of each chip are disposed at locations which lie beyond nearest edges of the adjacent chip in the stack.

Electrical interconnections between the element contacts 144 of each chip 140, 142 and corresponding contacts (not shown) on the package substrate 148 can be provided through electrically conductive structure such as wire bonds 146 which extend above the face 145 of each chip. Similar to the controller chip package, electrical interconnection between terminals 150 of the memory chip package 120 and corresponding contacts 134 of the circuit panel 130 is provided through joining elements 152. Each chip 140 or 142 can have a structure such as the exemplary chip 142 shown in FIG. 6. The element contacts 144 on a face 145 of the chip 140 include a set of contacts configured to carry command address information, e.g., contacts C/A CH 1, which are sufficient to specify a memory storage location in a memory storage array within the chip. The element contacts 144 on the face 145 also include a set of contacts configured to carry data, e.g., contacts DQ CH 1, which may be bi-directional data signals for storage of data to or retrieval of data from a memory storage location in the memory storage array within the chip. In one example, each group C/A CH 1 and each group DQ CH 1 of contacts can be "peripheral contacts" arranged at or near a respective opposite edge 147, 149 of the face 145. Such arrangement of contacts is typical of memory chips which conform to low power double data rate ("LPDDRx") standards such as LPDDR3 and follow-on standards. Such arrangement of contacts can also be provided on memory chips that conform to other standards, e.g., double data rate ("DDRx") standards including DDR3 and its follow-ons.

Figure 6:
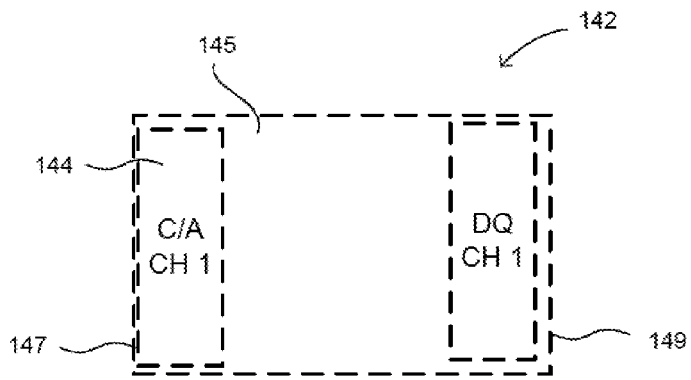
FIG. 6 is a top plan view showing an arrangement of contacts at a face of a memory chip in accordance with an embodiment.

Although memory chips which conform to a DDRx standard are typically manufactured with center-bond contacts disposed in a central region of the face rather than near the edges of the face, such chips can be modified by processing usually performed at wafer-level which redistributes the contacts from the central region of the face to areas as shown in FIG. 6. For example, an electrically conductive redistribution structure of traces and interconnects can be formed coupled to the central region contacts of chips on a wafer to provide redistribution contacts on each chip. Thereafter, the wafer can be severed into a plurality of individual chips each having the arrangement of contacts 144 as shown in FIG. 6.

One of the features of the exemplary microelectronic assembly shown in FIG. 3 is that the total electrical lengths or the lengths of the "nets" of specific groups of interconnections between contacts on the controller chip 160 (hereinafter, "controller contacts") and corresponding contacts electrically coupled therewith on a memory chip 140 or 142 (hereinafter, "memory contacts") can be brought within a permitted tolerance by adjusting the lengths of traces on the memory chip package rather than by increasing the lengths of some panel traces as in the assembly described above relative to FIGS. 1 and 2. The specific groups of interconnections within which the total electrical lengths are conformed to within the permitted tolerance corresponding to each of the above-discussed terminal groups of the controller chip package. In one example, the permitted ranges of total electrical lengths for different groups of interconnections can be different. Therefore, the permitted tolerance for the total electrical lengths for address signals, for example, in the C/A CH 0 group of chip to chip interconnections can be different from the permitted range of total electrical lengths for the address signals of the C/A CH 1 group of the chip to chip interconnections. Similarly, the permitted tolerances can be set differently for the group of chip to chip interconnections of the data signals of the DQ CH 0 group and for the group of chip to chip interconnections of the data signals of the DQ CH 1 group.

Thus, in accordance with this embodiment, the total electrical lengths of the interconnections between a group of controller contacts and a corresponding group of memory element contacts can be brought within a permitted tolerance by adjusting the lengths of the traces on the memory package 120 between the memory package terminals and the corresponding memory element contacts. This can be done for each of the groups of terminals which carry the types of signals such as the terminal groups which are configured to carry the C/A CH 0 information, the C/A CH 1 information, the DQ CH 0 data, and the DQ CH 1 data.

Furthermore, while the total electrical lengths of the interconnections between the controller chip 160 and each memory chip 140, 142 are conformed to within the permitted tolerance by adjusting the lengths of traces on the memory chip package 120, one result of adjusting the trace lengths on the memory chip package can be that the differences in the adjusted lengths of the traces on the memory chip package within each group of interconnections may exceed the permitted tolerance for those controller chip to memory chip interconnections.

Figure 7:
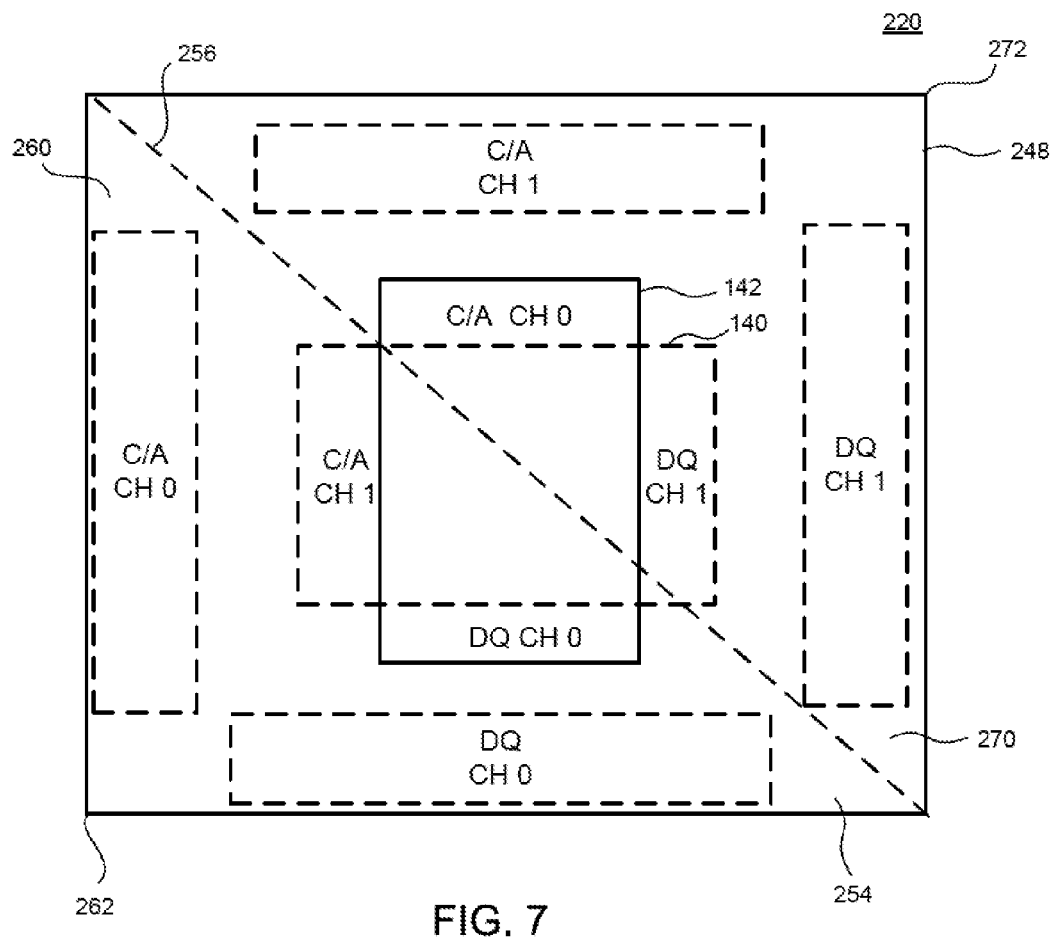
FIG. 7 is a top plan view of a memory package in accordance with an embodiment.

FIG. 7 illustrates a memory chip package 220 having a first exemplary "ballout", i.e., arrangement of terminals thereon, in accordance with an embodiment of the invention. The package 220 has a configuration generally as shown and described above relative to FIG. 5, wherein first and second chips or microelectronic elements 140, 142 with first and second memory storage arrays thereon, the chips stacked in first and second transverse orientations overlying an upwardly facing surface 138 of the substrate. First and second memory storage arrays are provided on the chips 140, 142. For example, a first memory storage array for a first memory channel "0" can be provided on chip 142 and a second memory storage array for a second memory channel "1" can be provided on chip 140. The contacts of each group of contacts on a chip in the package are electrically coupled with the corresponding memory package terminals of the same group. Therefore, the C/A CH 0 contacts of chip 142 are coupled with the C/A CH 0 terminals of the package, and the DQ CH 0 contacts of chip 142 are coupled with the DQ CH 0 terminals of the package. Similarly, the C/A CH 1 contacts of chip 140 are coupled with the C/A CH 1 terminals of the package, and the DQ CH 1 contacts of chip 140 are coupled with the DQ CH 1 terminals of the package.

As shown in FIG. 7, a substrate 248 of the package has a terminal-bearing surface 254 which corresponds to the lower surface of the substrate 148 in FIG. 5 on which terminals 150 are disposed. The surface 254 of the substrate is divided by a theoretical diagonal 256 extending between opposite corners of the substrate, e.g., third and fourth corners, which bisects the surface 254 into a first half area 260 that extends from the diagonal to a first corner 262 of the substrate, and a second half area 270 that extends from the diagonal to another corner, e.g., a second corner 272 of the substrate that is opposite the first corner 262. In the example arrangement shown in FIG. 7, the terminal groups for each memory channel supported by the memory chip package can be disposed at locations in the respective half areas 260, 270 of the surface 254. Specifically, the first half area 260 of the surface 254 can have the C/A CH 0 group of terminals and the DQ CH 0 group of terminals thereon, these terminal groups being configured to carry address information and data for providing access to a first memory channel. In one example, all such terminals of each group may be disposed at locations in the first half area. In another example, a smaller number of such terminals of one or both groups which carries a majority of the address information or data therefor may be disposed at locations in the first half area.

Similarly, the second half area 270 of the surface 254 can have the C/A CH 1 group of terminals and the DQ CH 1 group of terminals thereon, these terminal groups being configured to carry address information and data for providing access to a second memory channel. In one example, all such terminals of each C/A CH 1 group and DQ CH 1 may be disposed at locations in the second half area. However, in another example, a smaller number of such terminals of one or both groups which carries a majority of the address information or data therefor may be disposed at locations in the second half area.

Further, as apparent in FIG. 7, the group of C/A CH 1 terminals are disposed at locations on the surface 254 of the substrate which may be closer to the C/A CH 0 element contacts on chip 142 than to the C/A CH 1 element contacts on chip 140. Stated another way, "geometric", i.e., straight line, distances between these address information carrying contacts of each microelectronic element and the corresponding terminals coupled thereto for the corresponding memory channel are relatively long. In addition, these geometric distances may be even longer than the geometric distances that exist between the C/A CH 0 contacts of a microelectronic element and the C/A CH 1 terminals of the non-corresponding memory channel which are not coupled thereto.

In addition, as further seen in FIG. 7, the C/A CH 1 chip contacts are aligned with the first half area 260 of the surface 254 of the package, and the C/A CH 0 chip contacts are aligned with the second half area 270. Stated another way, the memory chip package as shown in FIG. 7 may obey the relation that the address information carrying contacts of each microelectronic element can be aligned with the half area at which the non-coupled second terminals of the non-corresponding memory channel are disposed. That is, the address information carrying contacts of each microelectronic element can be aligned with the half area which is opposite from the half area at which the corresponding address information terminals coupled thereto are disposed.

Figure 8:
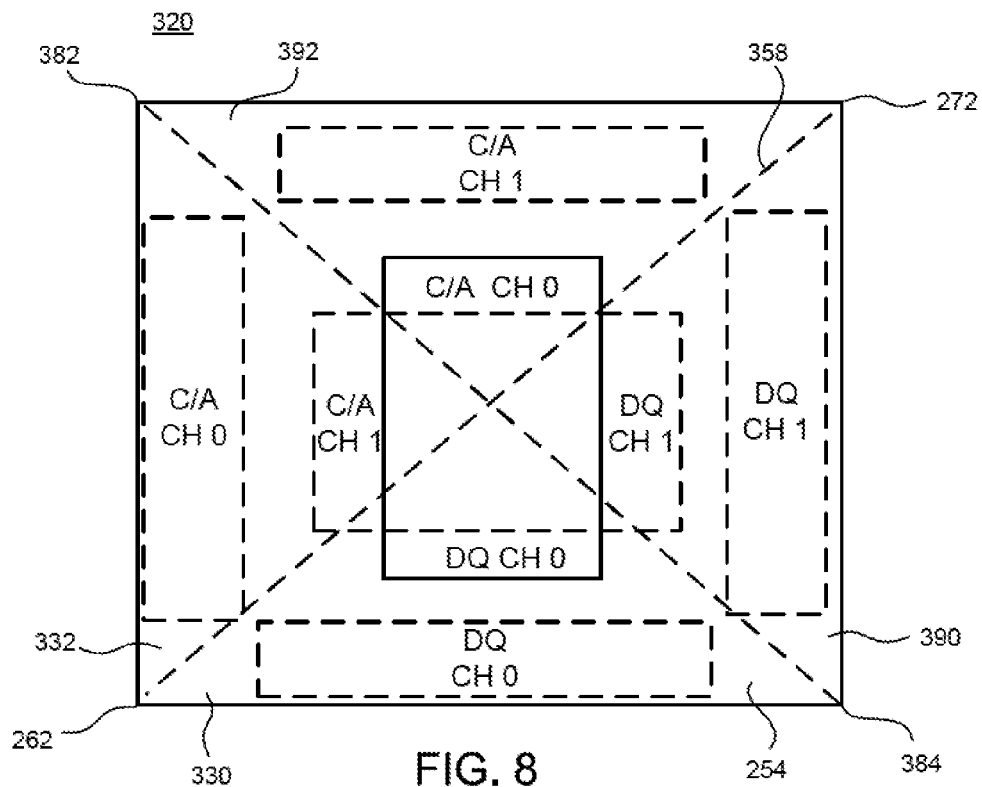
FIG. 8 is a top plan view of a memory package in accordance with an embodiment.

As further seen in the embodiment of a memory chip package 320 shown in FIG. 8, each half area of the surface 254 of the substrate may be further defined by first and second quarter area portions of the surface 254, each quarter area portion extending between a third or a fourth corner of the substrate or package, respectively, and a second diagonal of the package that extends between the above-described first and second corners 262, 272. Then the DQ CH 0 terminals can be disposed at locations of the a first quarter area portion 330 and the C/A CH 0 terminals can be disposed locations of a second quarter area portion 332 within the same half area as defined above. The DQ CH 1 terminals and the C/A CH 1 terminals are disposed in a like arrangement in first and second quarter area portions 390, 392 of the second half area. Thus, in the example of FIG. 8, the data carrying DQ terminals for each memory channel are disposed at locations of a first quarter area portion of each half area, and the address information carrying C/A terminals for each memory channel are disposed at locations of a second quarter area portion of each half area.

Figure 9:
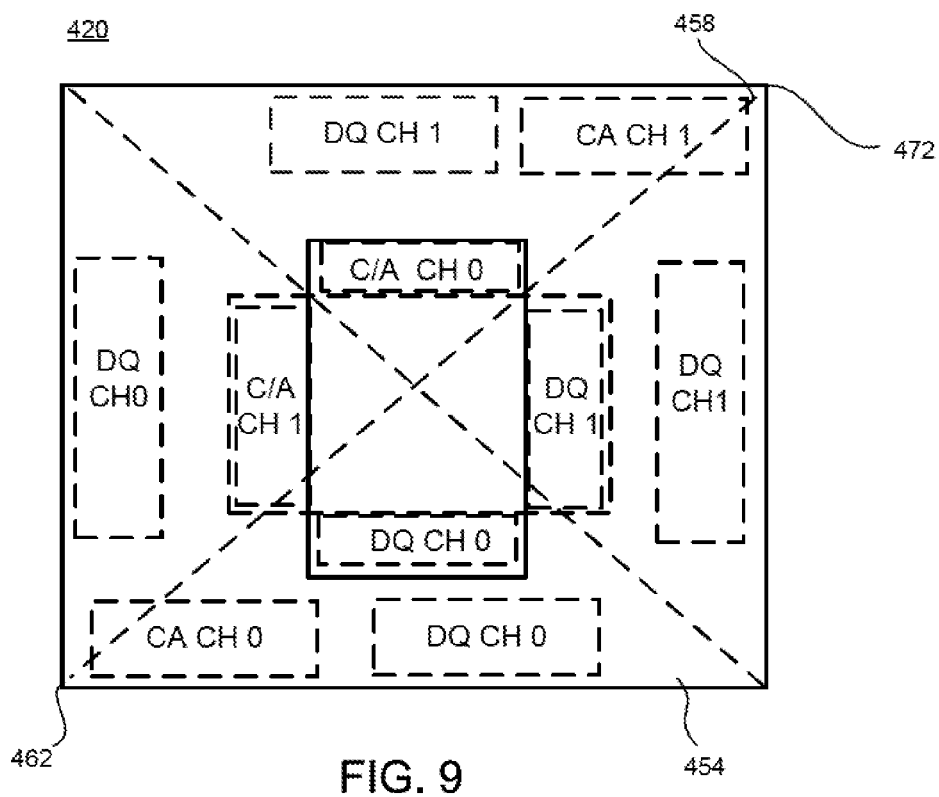
FIG. 9 is a top plan view of a memory package in accordance with an embodiment.

FIG. 9 illustrates a memory chip package 420 according to a variation of the embodiment seen in FIG. 8. This example may conform to the above relation described for FIG. 7 in which the terminals of each memory channel are disposed at locations of one of the half areas 260, 270 of the surface of the substrate. However, in this variation, the terminals which are configured to carry address information for each memory channel are disposed at locations which are between first and second portions of the data terminals for such memory channel. As seen in FIG. 7, the terminals configured to carry address information for each memory channel may span, i.e., be disposed on both sides of, a second diagonal 458 extending between corners 462 and 472 which bisects the terminal-bearing surface 454 of the substrate. In addition, the data terminals for each memory channel can be disposed in two areas which are generally on opposite sides of the area in which the address information carrying terminals are disposed.

Figure 10:
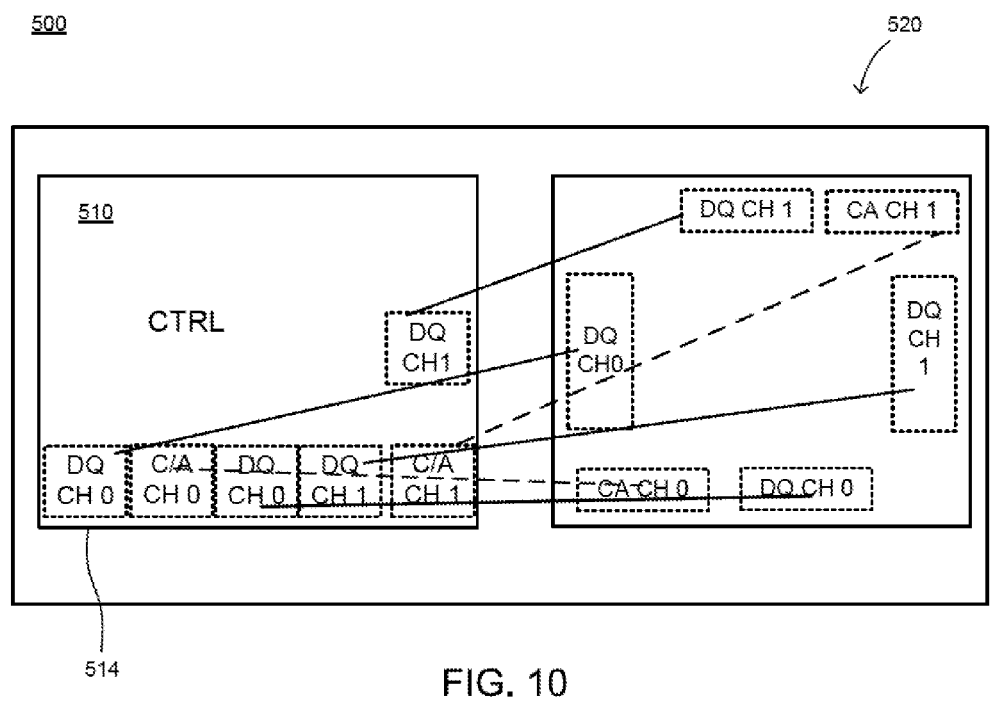
FIG. 10 is a top plan view of a microelectronic assembly in accordance with one embodiment.

FIG. 10 illustrates a microelectronic assembly in accordance with a further embodiment of the invention in which the controller chip package 510 has a different arrangement of terminals thereon, where the specific groups of memory channel terminals can be disposed closer to an edge 514 of the controller chip package 510 that does not face toward the memory chip package 520. The memory chip package 520 may be as illustrated in FIG. 10, having terminals which conform to the arrangement shown in FIG. 9. Alternatively, the terminals on the memory chip package 520 may conform to one of the arrangements shown in FIG. 7 or FIG. 8. As seen in FIG. 10, the positions of the groups of address information carrying terminals and data carrying terminals for each memory channel on the memory chip package can be selected such that the geometric distances between each group of address information carrying or data carrying controller chip package terminals and the corresponding memory package terminals coupled thereto can be made relatively uniform. Specifically, the geometric distances between the data carrying terminals DQ CH 0 on the controller chip package 510 and the DQ CH 0 data carrying terminals coupled thereto on the memory chip package 520 lie within a relatively narrow range of values. This feature of microelectronic assembly 500 may simplify the process for performing trace length matching on the memory chip package such as described above, since there may be smaller differences in the total electrical lengths of the interconnections in each group of address interconnections or data interconnections.

Figure 11:
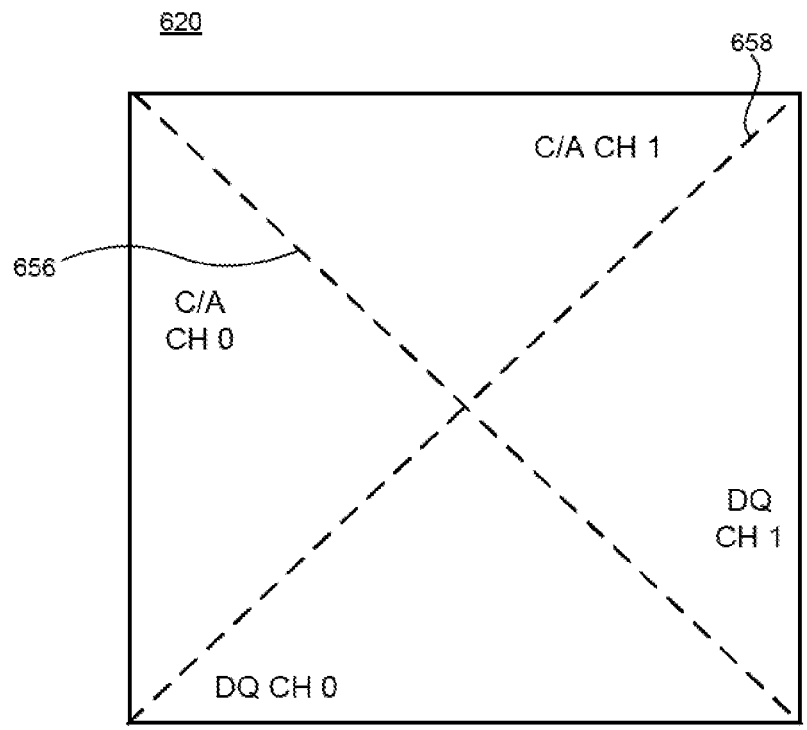
FIG. 11 is a top plan view of a memory package in accordance with an embodiment.
Figure 12:
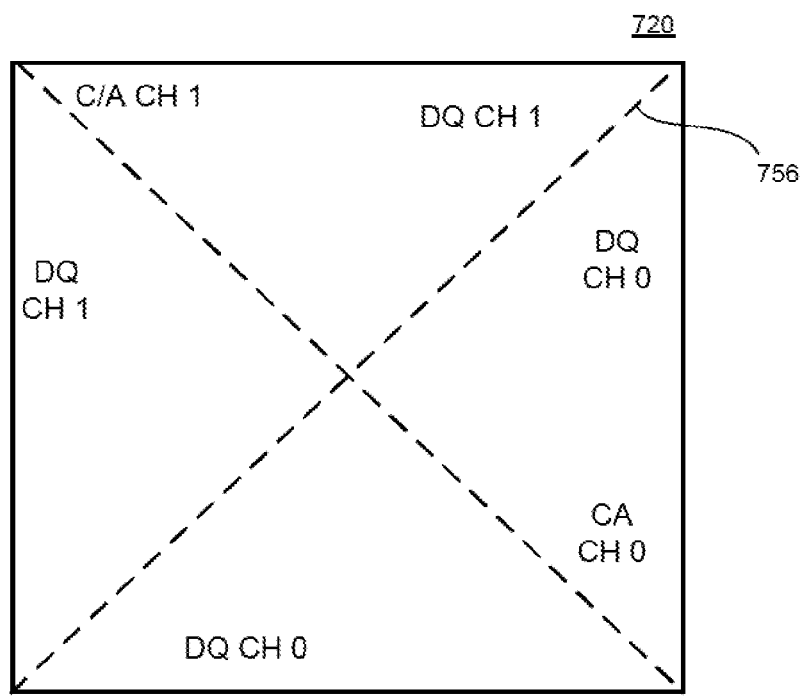
FIG. 12 is a top plan view of a memory package in accordance with an embodiment.

FIG. 11 and FIG. 12 illustrate further variations of the terminal arrangements which can be provided on a surface of a memory chip package 620 or 720 similar to the memory chip package 420 described above. In these examples, the data terminals for each memory channel can additionally be disposed at locations which span a diagonal 656, 658 of the surface of the package substrate. FIG. 12 illustrates a rearrangement of the terminal groups shown in FIG. 11. However, in each case, the arrangement of groups of terminals and their positions with respect to a half area of the surface of the package substrate obeys the relationship discussed above with respect to FIG. 7. Thus, a majority of the address information carrying terminals and data carrying terminals for a particular channel are disposed in one of the half areas bounded by the diagonal 656 of the substrate surface of package 620. In addition, a majority of the address information carrying terminals and data carrying terminals for a particular channel are disposed in one of the half areas bounded by the diagonal 756 of the substrate surface of package 720.

Figure 13:
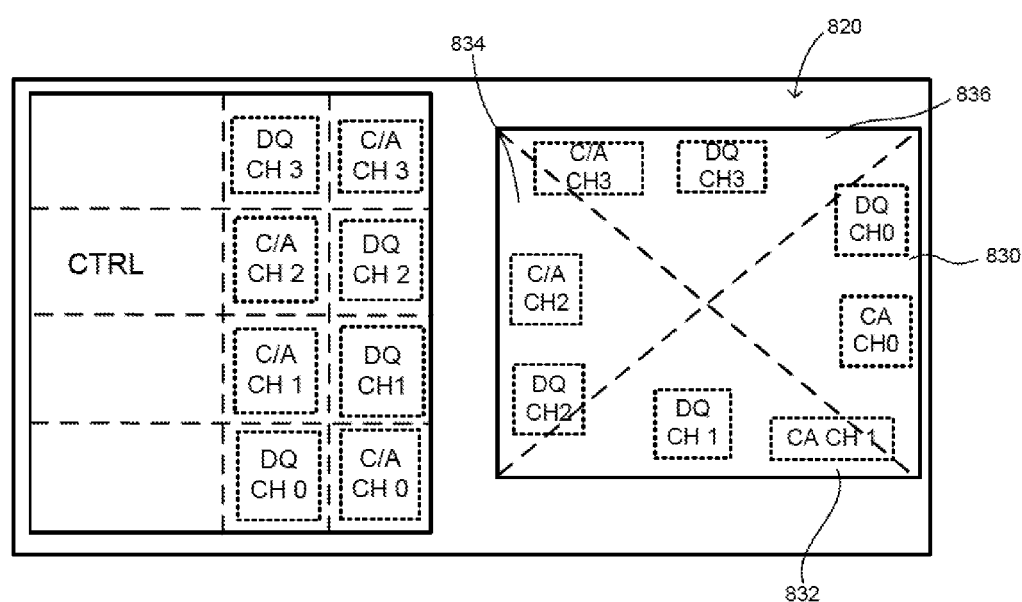
FIG. 13 is a top plan view of a microelectronic assembly in accordance with one embodiment.

FIG. 13 illustrates an embodiment in accordance with a further variation in which the controller chip package 810 and the memory chip package 820 are each configured to support four memory channels denoted CH 0, CH1, CH2 and CH3. In this case, the arrangement of the terminal groups on the controller chip package 810 and the memory chip package 820 may be as shown in FIG. 13. In a specific example which is shown in FIG. 13, a majority of, or in some cases, all of the data carrying terminals and the address information carrying terminals for each memory channel can be disposed within an individual quarter area portion of the surface of the substrate. For example, as seen in FIG. 13, a majority of, or all of the C/A CH0 terminals and the DQ CH 0 terminals are disposed at locations within the same quarter area portion 830 of the substrate surface. This relationship applies to the other groups of address carrying terminals and data carrying terminals of the memory chip package 820 for each of the other memory channels disposed in their respective quarter area portions 832, 834, and 836. Moreover, if the controller chip package and the memory chip package need to support an even greater number of channels, each group of data carrying terminals and each group of address information carrying terminals for the same memory channel on the memory chip package can be disposed in neighboring areas at the surface of the substrate.

Figure 14:
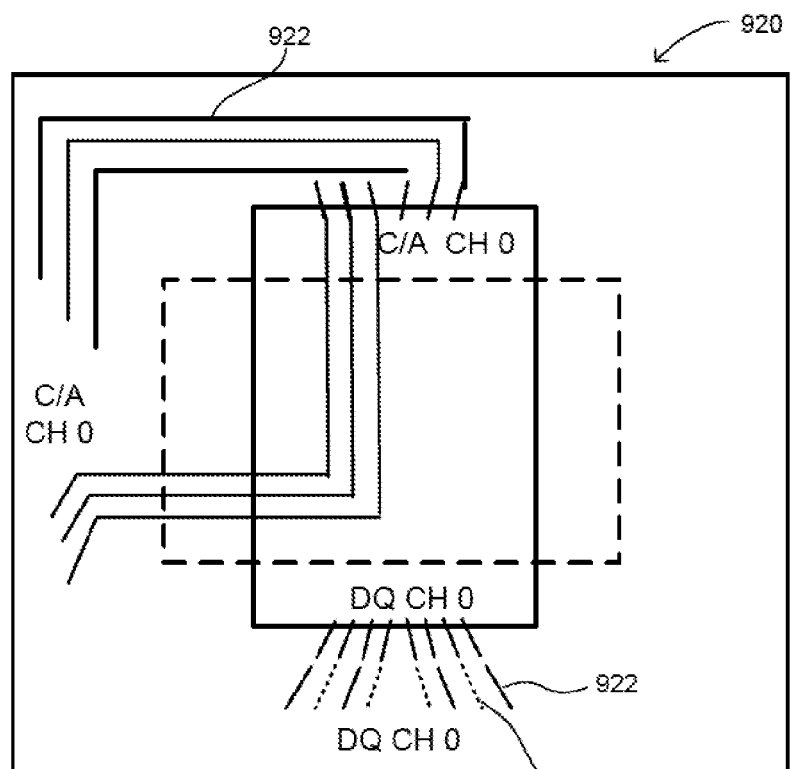
FIG. 14 is a plan view illustrating an internal arrangement of a memory package in accordance with an embodiment.
Figure 15:
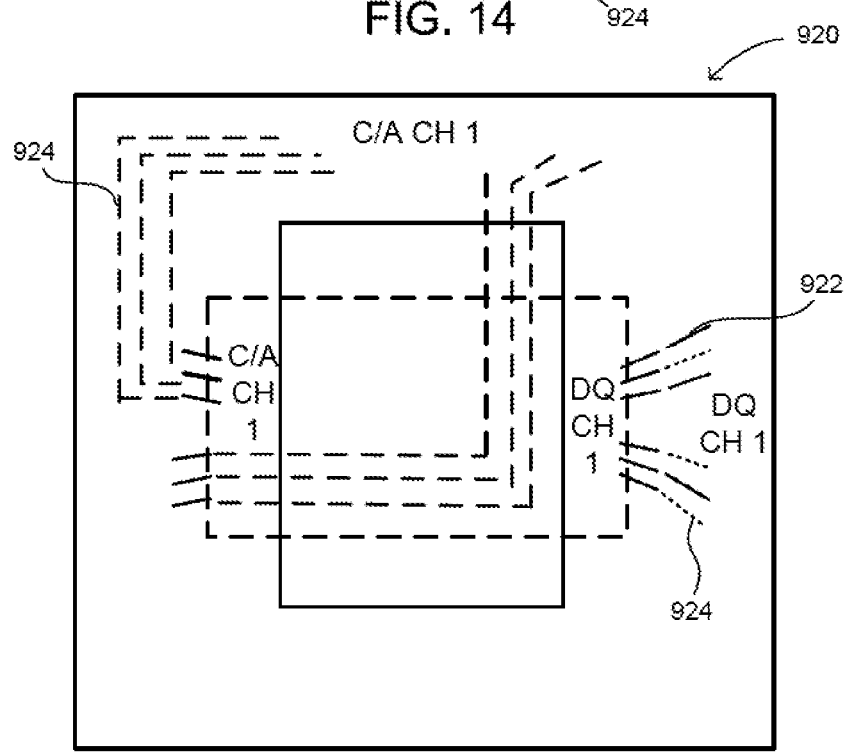
FIG. 15 is a plan view illustrating an internal arrangement of a memory package in accordance with an embodiment.

FIGS. 14 and 15 depict an example of the on-package routing between the terminals of the memory chip package 920 and the corresponding contacts to which they are electrically coupled. Routing may be provided in one or two routing layers, wherein solid lines 922 depict traces of a first routing layer and dashed lines 924 depict traces of a second routing layer. Further, the traces carrying the address information such as between the C/A CH 0 terminals and the C/A CH 0 chip contacts may be less direct than the traces which electrically couple the data terminals, such as the DQ CH 0 terminals with the corresponding DQ CH 0 chip contacts. Moreover, the traces which electrically couple the data terminals with the data contacts may be simple "fan-out" type routing provided in either one or two routing layers.

Figure 16:
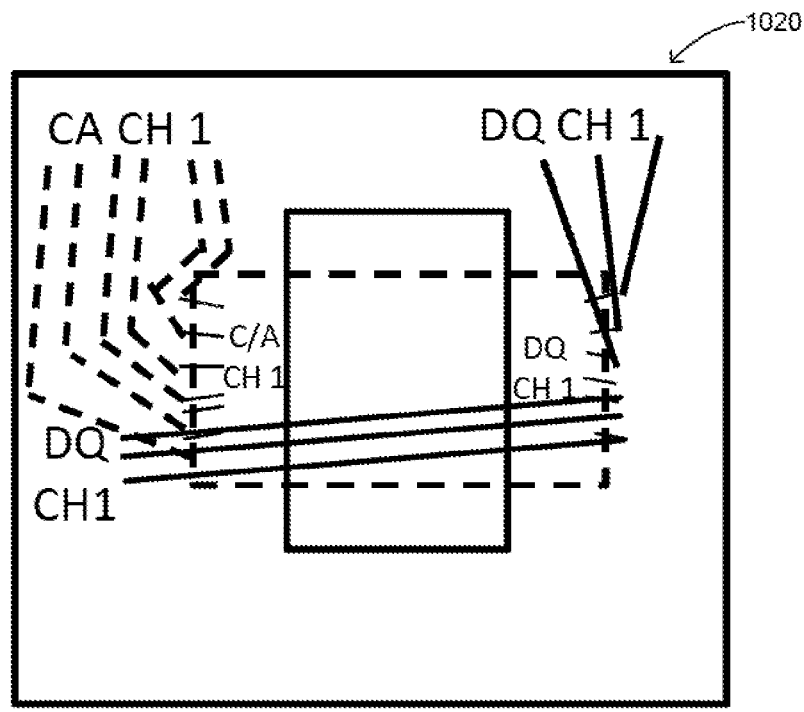
FIG. 16 is a plan view illustrating an internal arrangement of a memory package in accordance with an embodiment.
Figure 17:
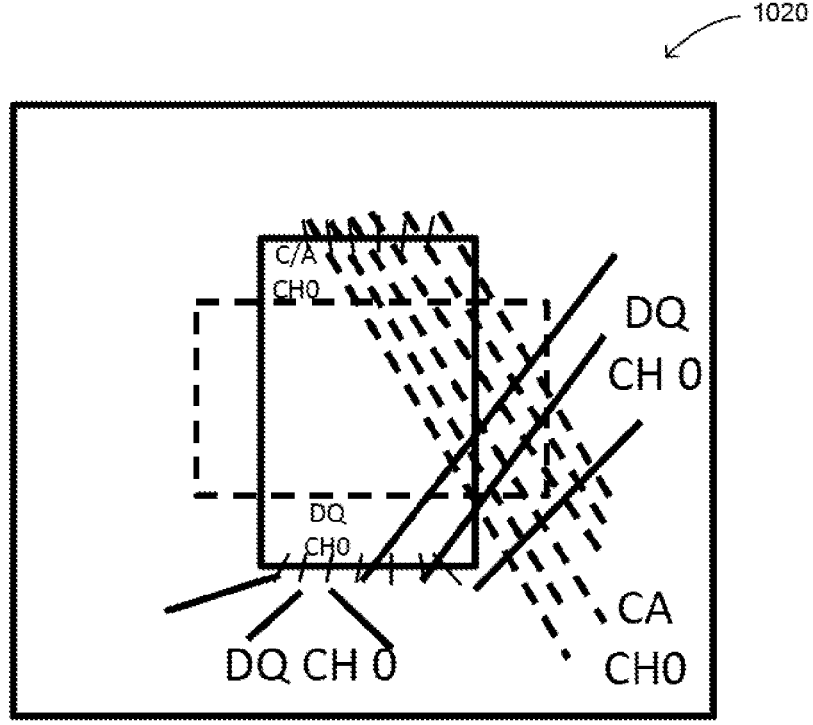
FIG. 17 is a plan view illustrating an internal arrangement of a memory package in accordance with an embodiment.

FIGS. 16 and 17 depict another example of the on-package routing between the terminals of the memory chip package 1020 and the corresponding contacts to which they are electrically coupled. In this variation, the traces 1024 which electrically couple the address information carrying terminals with the corresponding chip contacts, such as between the C/A CH 0 terminals and the C/A CH 0 chip contacts, can be routed in a different routing layer than the routing layer used to electrically couple the data carrying terminals with the data contacts. FIGS. 16 and 17 illustrate an exemplary memory chip package that may have an arrangement of terminals thereon that are described above relative to FIG. 9, 10, or 13.

Figure 18:
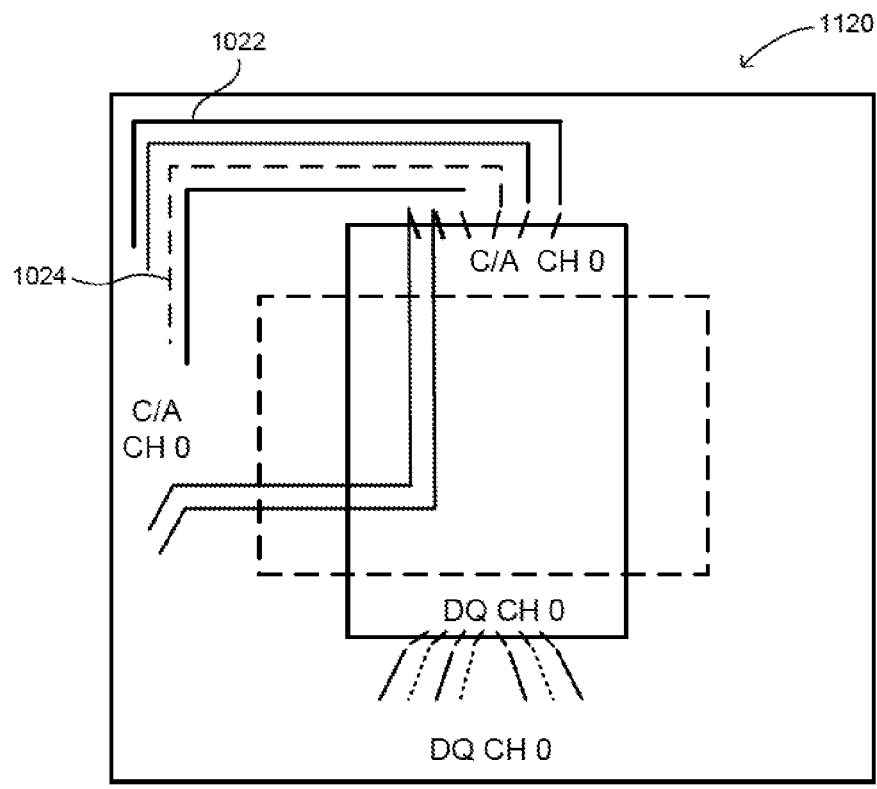
FIG. 18 is a plan view illustrating an internal arrangement of a memory package in accordance with an embodiment.
Figure 19:
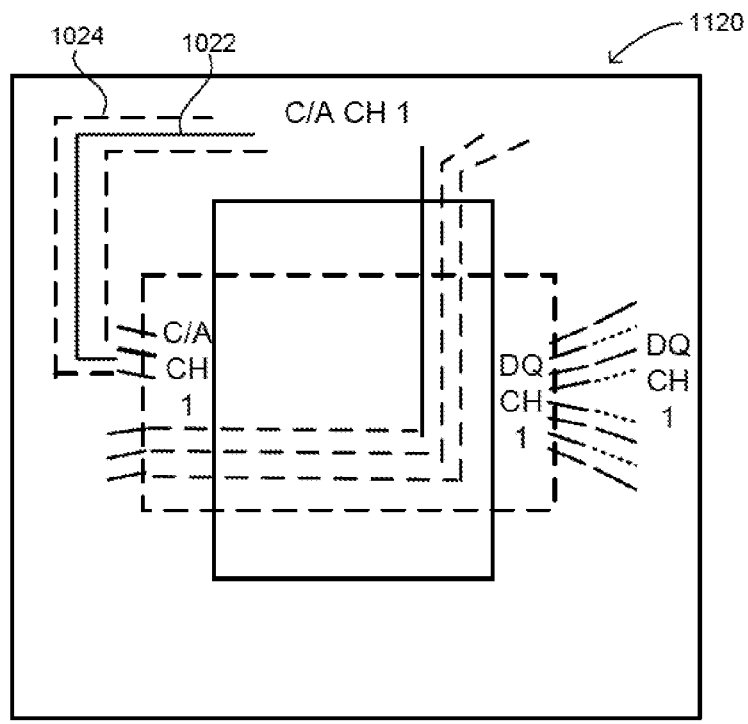
FIG. 19 is a plan view illustrating an internal arrangement of a memory package in accordance with an embodiment.

FIGS. 18 and 19 depict an example of a memory chip package 1120 in which the traces 1122, 1124 electrically coupling the address information carrying terminals and the corresponding chip contacts for each memory channel can be provided in two or more routing layers, and the same can be done for the traces which electrically couple the data terminals with the data contacts.

Figure 20:
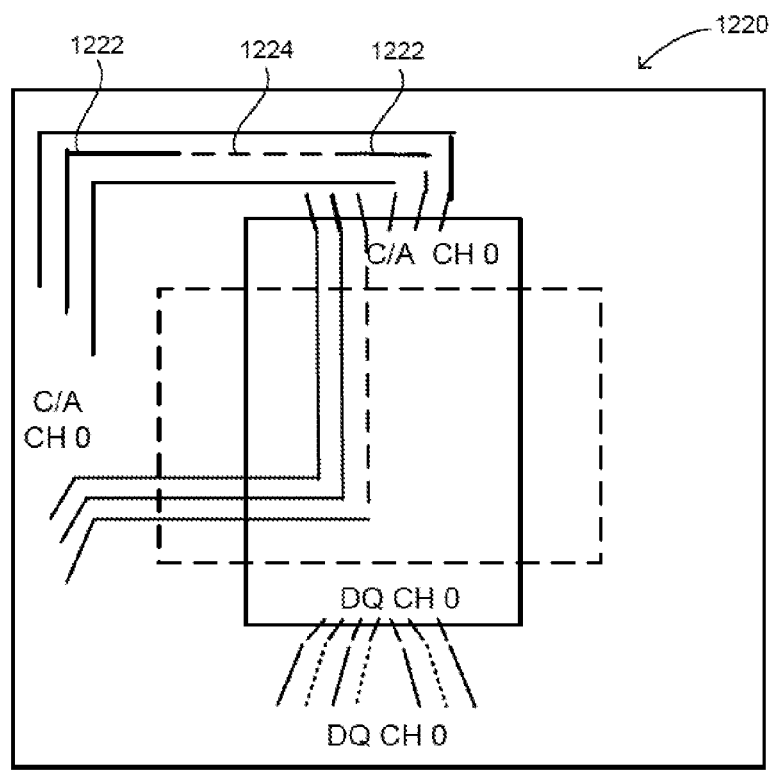
FIG. 20 is a plan view illustrating an internal arrangement of a memory package in accordance with an embodiment.
Figure 21:
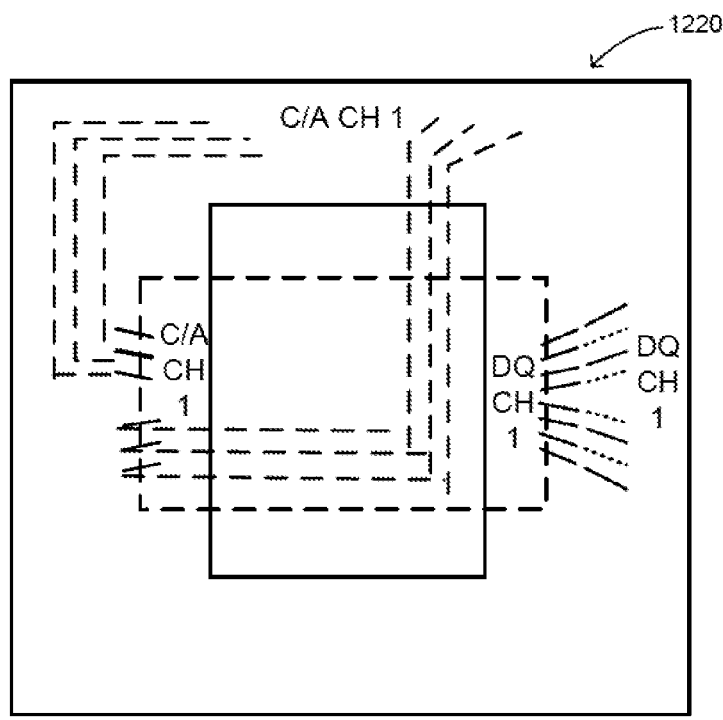
FIG. 21 is a plan view illustrating an internal arrangement of a memory package in accordance with an embodiment.

FIGS. 20 and 21 depict a further example of a memory chip package 1220 in which an electrical interconnection between each of the address information carrying terminals and the respective chip contact for each memory channel can be provided partly by one or more traces 1222 in one routing layer and partly by one or more traces 1224 in another routing layer on the package substrate. Moreover, this can be done for packages having three or more routing layers in which the electrical interconnections between a terminal and the corresponding contact can be provided by traces in any combination of such routing layers. The same can be done for the traces which electrically couple the data terminals with the data contacts.

Figure 22:
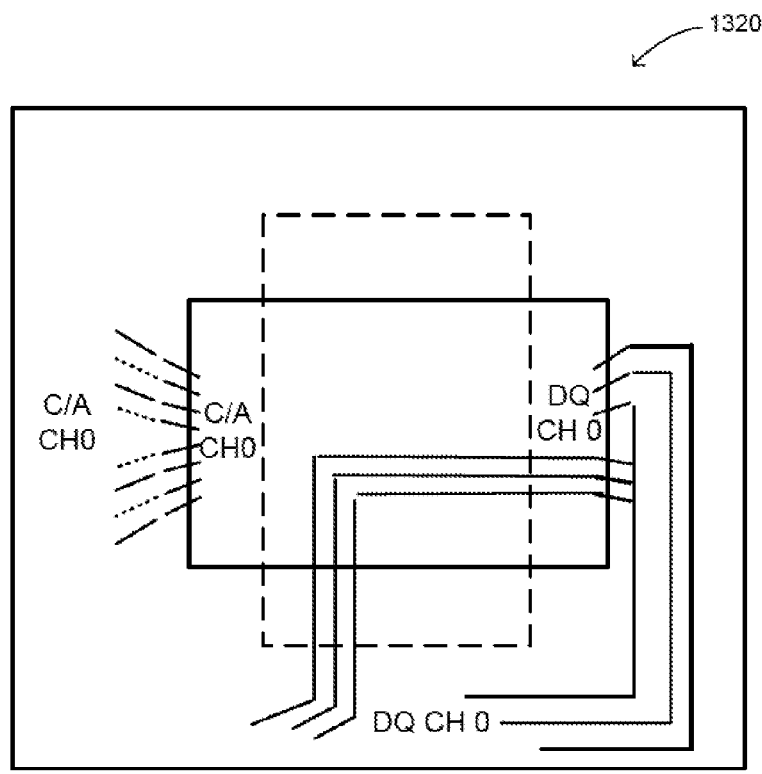
FIG. 22 is a plan view illustrating an internal arrangement of a memory package in accordance with an embodiment.
Figure 23:
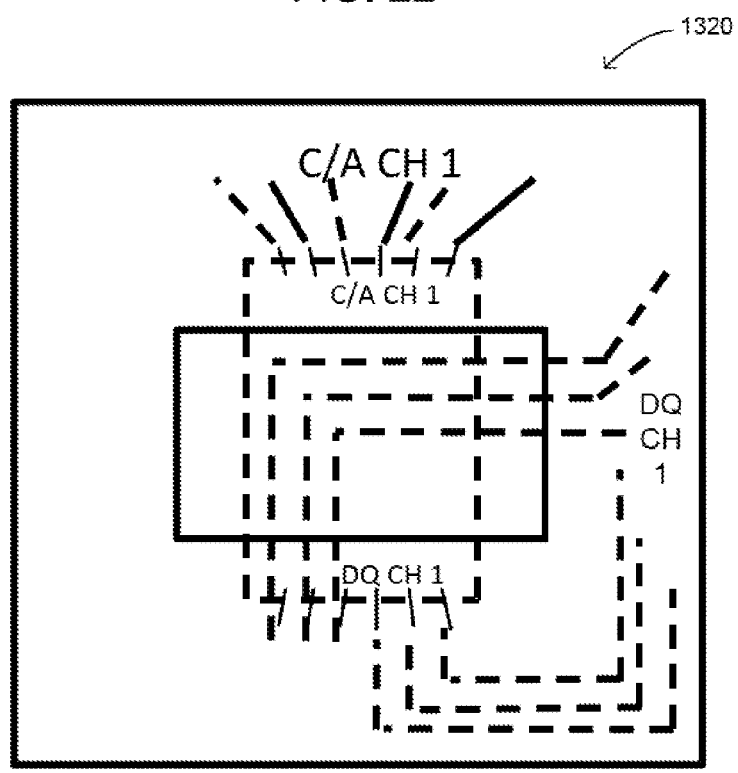
FIG. 23 is a plan view illustrating an internal arrangement of a memory package in accordance with an embodiment.

FIGS. 22 and 23 illustrate a further example of a memory chip package 1320 in which the traces carrying data such as between the DQ CH 0 terminals and the DQ CH 0 chip contacts may be less direct than the traces which electrically couple the address information carrying terminals and contacts, such as the C/A CH 0 terminals with the corresponding C/A CH 0 chip contacts. In this example, the traces which electrically couple the address information carrying terminals with the corresponding contacts may be simple "fan-out" type routing provided in either one or two routing layers.

Figure 24:
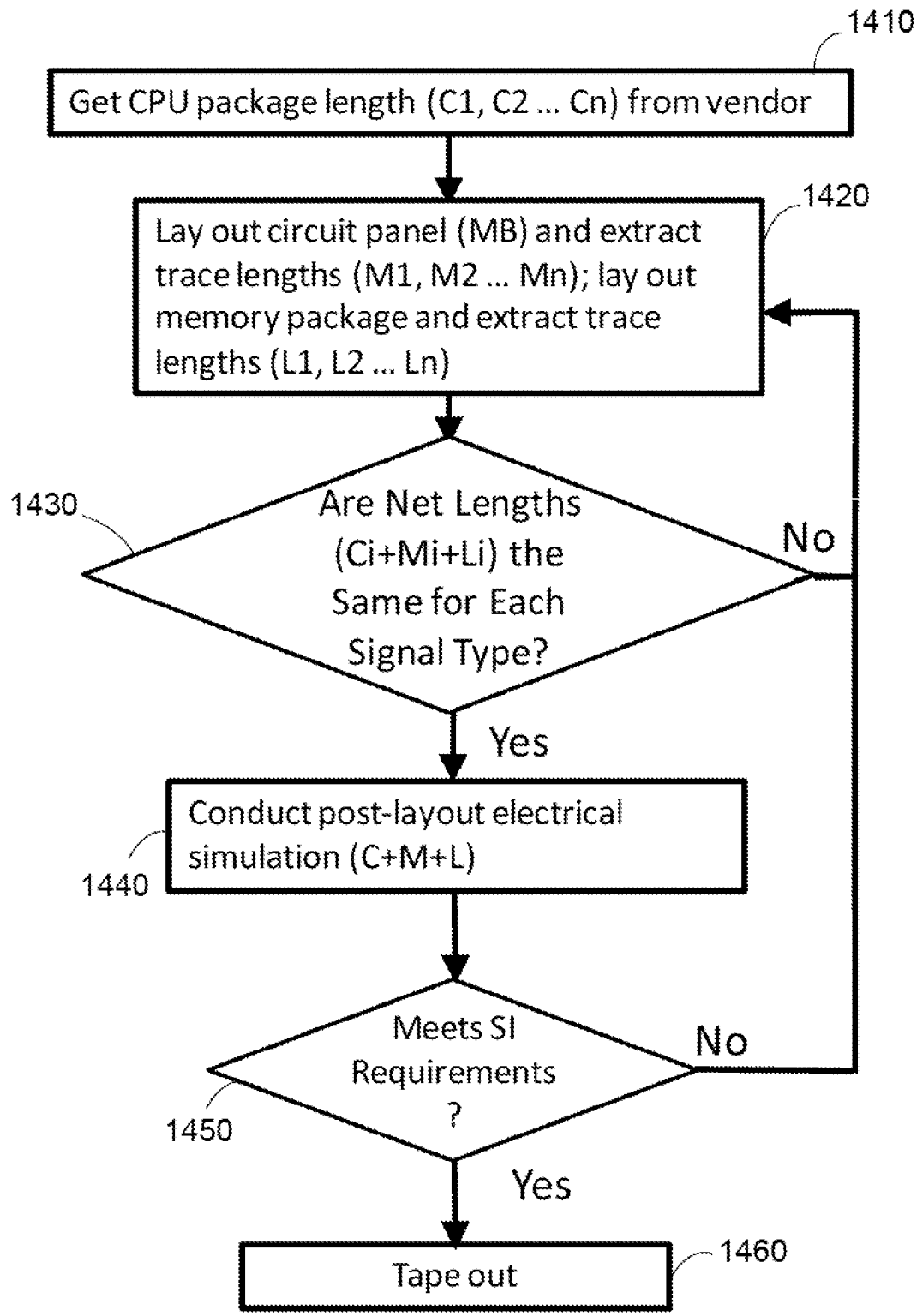
FIG. 24 is a flow diagram illustrating a method of designing a microelectronic assembly having a set of electrical connections having matched lengths in accordance with an embodiment.

FIG. 24 depicts an exemplary process flow for designing the lengths of the traces to be provided on the memory chip package in accordance with an embodiment of the invention. Heretofore, as described above, the lengths of traces on a memory chip package were a given or fixed quantity, such that only the lengths of the circuit panel traces of a microelectronic assembly such as that shown in FIG. 1 were adjusted when designing a microelectronic assembly with electrical interconnections or "nets" of the same total electrical lengths. By contrast, in the method according to this embodiment, the lengths of the nets between controller chip and memory chip within the microelectronic assembly are determined by a process which involves designing the lengths of the traces on the memory chip package. Accordingly, in the example process shown in FIG. 24, the lengths of traces within the controller chip package are first obtained (1410), and then the process (1420) of laying out traces on the circuit panel, e.g., motherboard "MB" is begun. During this process 1420 the positions of the controller chip package and the memory chip package on the circuit panel are determined and the traces on the circuit panel which couple the controller package terminals and the memory package terminals are laid out. From the results of this work, the trace lengths M1, M2, . . . Mn between the controller package terminals and the memory package terminals are extracted. The trace lengths L1, L2, . . . , Ln of the traces on the memory package are then determined which are needed to provide the correctly adjusted "net lengths" (total electrical lengths) of the controller chip to memory chip electrical interconnections that are represented by all the lengths C+M+L in a net thereof.

Thereafter, at 1430, a check is made to determine whether all the net lengths are the same within a permitted tolerance for each signal type. For example, the net lengths need to be the same for all C/A CH 0 type signals, and the net lengths need to be the same for all C/A CH 1 type signals, but the C/A CH 0 net lengths need not be the same as the C/A CH 1 net lengths. Similarly, the net lengths need to be the same for all DQ CH 0 type signals, and the net lengths need to be the same for all DQ CH 1 type signals, but the DQ CH 0 net lengths need not be the same as the DQ CH 1 net lengths. If this condition is not met, the process 1420 is resumed again until the condition is met.

Then, at 1440, after the check at 1430 is met, a post layout electrical simulation can be performed using the net lengths (C+M+L) of the layout determined by the above processing. Block 1450 represents a determination of whether the proposed layout meets signal integrity requirements. If the SI requirements are not met, the layout process resumes again at 1420 and the process flow continues as above. Finally, when the determination at 1450 passes, layout processing is completed and the layout can be passed to a tape out process 1460 for generating the final circuit panel layout and memory chip package layout.

Figure 25:
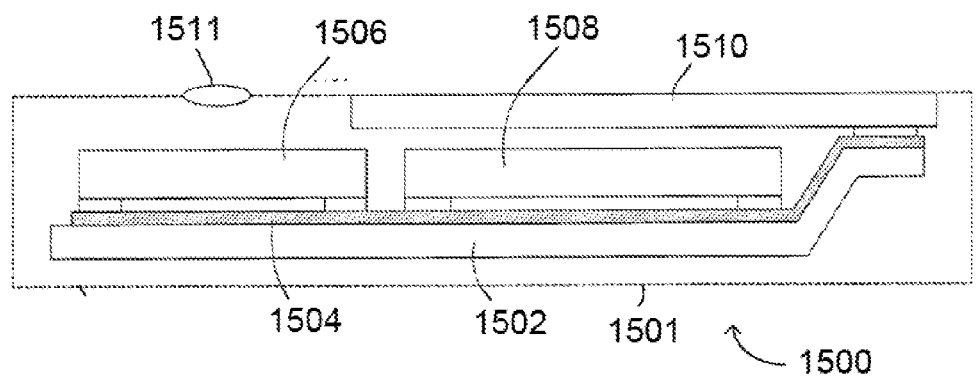
FIG. 25 is a schematic sectional view illustrating a system in accordance with an embodiment.

The microelectronic packages and microelectronic assemblies described above with reference to FIGS. 3 through 23 can be utilized in construction of diverse electronic systems, such as the system 1500 shown in FIG. 25. In specific examples and without limitation, a system may be a tablet, smartphone, other mobile device, or notebook or laptop computer or other type of processor-implemented device or computer. For example, the system 1500 in accordance with a further embodiment of the invention may include one or more microelectronic packages or assemblies as described above in conjunction with other electronic components 1508 and 1510.

In the exemplary system 1500 shown, the system can include a circuit panel, motherboard, or riser panel 1502 such as a flexible printed circuit board, and the circuit panel can include numerous conductors 1504, of which only one is depicted in FIG. 25, interconnecting the modules or components 1506 with one another. Such a circuit panel 1502 can transport signals to and from each of the microelectronic packages and/or microelectronic assemblies included in the system 1500. However, this is merely exemplary; any suitable structure for making electrical connections between the modules or components 1506 can be used.

In a particular embodiment, the system 1500 can also another component such as the semiconductor chip 1508 and component 1510 is a display screen, but any other components can be used in the system 1500. Of course, although only two additional components 1508 and 1510 are depicted in FIG. 25 for clarity of illustration, the system 1500 can include any number of such components.

Modules or components 1506 and components 1508 and 1510 can be mounted in a common housing 1501, schematically depicted in broken lines, and can be electrically interconnected with one another as necessary to form the desired circuit. The housing 1501 is depicted as a portable housing of the type usable, for example, in a smartphone or cellular telephone and screen 1510 can be exposed at the surface of the housing. In embodiments where a structure 1506 includes a light-sensitive element such as an imaging chip, a lens 1511 or other optical device also can be provided for routing light to the structure. Again, the simplified system shown in FIG. 25 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

Thus, the memory chip package may have a structure other than that shown and described herein. For example, the memory chip package may include memory chips having face-down orientations with wire bonds extending through one or more apertures in the substrate, or may include one or more memory chips in face-down orientation and one or more chips in face-up orientation.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic package configured to provide multiple channel memory access, comprising:
    a substrate having first and second opposite surfaces, the first surface having third and fourth corners opposite one another along a first diagonal of the first surface, and first and second corners opposite one another along a second diagonal of the first surface transverse to the first diagonal, the first diagonal dividing the first surface in first and second half areas each extending from the first diagonal to one of the first corner or the second corner, the substrate including a plurality of terminals at the first surface, the terminals including first terminals configured to carry data and second terminals configured to carry address information, the first terminals and the second terminals in the first half area providing access to a first memory storage array corresponding to a first memory channel, and the first terminals and the second terminals in the second half area providing access to a second memory storage array corresponding to a second memory channel different from the first memory channel; and
    first and second microelectronic elements overlying the second surface and stacked in first and second orientations transverse to one another, the first and second microelectronic elements comprising the first and second memory storage arrays.

2. The microelectronic package of claim 1, wherein each of the microelectronic elements has a face parallel to the second surface, edges bounding the face, and contacts at the face, the contacts of each microelectronic element including first peripheral contacts at or near a first one of the edges, the first contacts configured to carry data, and second peripheral contacts at or near a second one of the edges opposite the first edge, the second contacts configured to carry address information.

3. The microelectronic package of claim 1, wherein the first terminals and the second terminals corresponding to the first memory channel are coupled to the first contacts and the second contacts of the first microelectronic element, respectively, and the first terminals and the second terminals corresponding to the second memory channel are coupled to the first contacts and the second contacts of the second microelectronic element, respectively.

4. The microelectronic package of claim 3, wherein geometric distances between the second contacts of each microelectronic element and the second terminals coupled thereto for the corresponding channel are longer than the geometric distances between the second contacts of each microelectronic element and the second terminals of the non-corresponding channel which are not coupled thereto.

5. The microelectronic package of claim 4, wherein the second contacts of each microelectronic element are aligned with the half area at which the non-coupled second terminals of the non-corresponding memory channel are disposed.

6. The microelectronic package of claim 5, wherein the second contacts of each microelectronic element are aligned with the half area which is opposite from the half area at which the corresponding second terminals coupled thereto are disposed.

7. The microelectronic package of claim 5, wherein each half area is further defined by first and second quarter area portions thereof extending between the third and fourth corners, respectively, and the second diagonal, wherein the first terminals in each half area are disposed in the first quarter area portion, and the second terminals in each half area span the second diagonal.

8. The microelectronic package of claim 5, wherein each half area is further defined by first and second quarter area portions thereof extending between the third and fourth corners, respectively, and the second diagonal, wherein the first terminals in each half area are disposed in the first quarter area portion, and the second terminals in each half area are disposed in the second quarter area portion.

9. The microelectronic package of claim 5, wherein the package is configured to provide access to a third memory storage array corresponding to a third memory channel, and to a fourth memory storage array corresponding to a fourth memory channel different from each of the first, second and third memory channels, wherein each half area is further defined by first and second quarter area portions thereof extending between the third and fourth corners, respectively, and the second diagonal, wherein the first terminals and the second terminals disposed in each quarter area portion are configured to provide access to a single one of the first, second, third and fourth memory channels.

10. A microelectronic assembly, comprising:
    a controller package comprising a microelectronic element having a memory controller function, the microelectronic element electrically coupled with a substrate having controller package terminals at a surface thereof, the controller package comprising controller contacts at a face of the microelectronic element thereof and controller package traces coupled between the controller package terminals and the controller contacts;

a memory package comprising a memory microelectronic element electrically coupled with a substrate having memory package terminals at a surface thereof, the memory package comprising memory element contacts at a face of the memory microelectronic element and memory package traces coupled between the memory package terminals and the memory element contacts;

a circuit panel, the controller package and the memory package assembled with the circuit panel at laterally separate, adjacent first and second non-overlapping areas of a same surface of the circuit panel and electrically coupled with one another through their respective terminals and the circuit panel therebetween, wherein a range of total electrical lengths defined by interconnections between the controller contacts and the memory element contacts is within a permitted tolerance, and a range of total electrical lengths defined by interconnections between the memory element contacts and the memory package terminals is outside the permitted tolerance.

11. The microelectronic assembly as claimed in claim 10, wherein the memory element contacts include first memory element contacts configured to carry first address information for a first memory channel and second memory element contacts configured to carry second address information for a second memory channel separately accessible from the first memory channel, wherein a first range of total electrical lengths of the interconnections between the controller contacts and the first memory element contacts is within a permitted first tolerance, and a second range of total electrical lengths of the interconnections between the controller contacts and the second memory element contacts is within a permitted second tolerance different from the permitted first tolerance.

12. The microelectronic assembly as claimed in claim 10, wherein electrical lengths of some of the memory package traces are longer than others of the memory package traces so as to compensate for some portions of the interconnections between the controller contacts and the memory element contacts on the circuit panel that are shorter than other portions of the interconnections between the controller contacts and the memory element contacts on the circuit panel.

13. The microelectronic assembly as claimed in claim 10, wherein an electrical length of each of a plurality of first interconnections usable to transfer a first type of signals from the controller contacts to respective ones of the memory element contacts is within a single permitted tolerance for transferring a first type of signals therebetween, and electrical lengths of some of the memory package traces corresponding to the first interconnections are longer than others of the memory package traces so as to compensate for some portions of the first interconnections on the circuit panel that are shorter than other portions of the first interconnections on the circuit panel.

14. The microelectronic assembly as claimed in claim 13, wherein at least one of: the first interconnections are configured to transfer each of at least 16 data signals of a memory channel per memory cycle; or the first interconnections are configured to transfer address information of a memory channel usable to specify an addressable location of a memory storage array of the memory microelectronic element.

15. The microelectronic assembly as claimed in claim 10, wherein the memory package terminals are at a first surface of the substrate thereof, the first surface having first and second half areas extending from a diagonal bisecting the first surface and a respective opposite corner of the first surface, wherein the memory package terminals include first terminals configured to carry data and second terminals configured to carry address information, the first terminals and the second terminals in the first half area providing access to a first memory storage array corresponding to a first memory channel, and the first terminals and the second terminals in the second half area providing access to a second memory storage array corresponding to a second memory channel different from the first memory channel; and the memory element comprises first and second microelectronic elements overlying the second surface and stacked in first and second orientations transverse to one another, the first and the second microelectronic elements comprising the first and second memory storage arrays.

16. The microelectronic assembly as claimed in claim 15, wherein each of the microelectronic elements has a face parallel to the second surface, edges bounding the face, and contacts at the face, the contacts of each microelectronic element including first peripheral contacts at or near a first one of the edges, the first contacts configured to carry data, and second peripheral contacts at or near a second one of the edges opposite the first edge, the second contacts configured to carry address information.

17. The microelectronic assembly as claimed in claim 16, wherein the first terminals and the second terminals corresponding to the first memory channel are coupled to the first contacts and the second contacts of the first microelectronic element, respectively, and the first terminals and the second terminals corresponding to the second memory channel are coupled to the first contacts and the second contacts of the second microelectronic element, respectively.

18. The microelectronic assembly as claimed in claim 17, wherein geometric distances between the second contacts of each microelectronic element and the second terminals coupled thereto for the corresponding channel are generally longer than the geometric distances between the second contacts of each microelectronic element and the second terminals of the non-corresponding channel which are not coupled thereto.

19. The microelectronic assembly as claimed in claim 18, wherein the second contacts of each microelectronic element are aligned with the half area at which the non-coupled second terminals of the non-corresponding memory channel are disposed.

20. The microelectronic assembly as claimed in claim 10, wherein at least portions of adjacent edges of the respective packages are less than two millimeters apart.

21. A microelectronic assembly, comprising:

a controller package comprising a microelectronic element having a memory controller function, the microelectronic element electrically coupled with a substrate having controller package terminals at a surface thereof;

a memory package comprising a substrate and memory package terminals at a first surface of the substrate, first and second memory microelectronic elements overlying a second surface of the substrate opposite from the first surface, the first and second memory microelectronic elements stacked in first and second orientations transverse to one another and comprising first and second memory storage arrays, respectively, wherein the first surface has first and second half areas extending from a diagonal bisecting the first surface and a respective opposite corner of the first surface, wherein the memory package terminals include first terminals configured to carry data and second terminals configured to carry address information, the first terminals and the second terminals in the first half area configured to provide access to a first memory storage array corresponding to a first memory channel, and the first terminals and the second terminals in the second half area configured to provide access to a second memory storage array corresponding to a second memory channel different from the first memory channel;

a circuit panel, wherein the controller package and the memory package are assembled with the circuit panel at laterally separate, adjacent first and second non-overlapping areas of a same surface of the circuit panel and electrically coupled with one another through their respective terminals and the circuit panel therebetween, wherein at least portions of the adjacent edges of the respective packages are less than two millimeters apart, wherein geometric distances between the second contacts of each microelectronic element and the second terminals coupled thereto for the corresponding channel are generally longer than the geometric distances between the second contacts of each microelectronic element and the second terminals of the non-corresponding channel which are not coupled thereto.

\* \* \* \* \*